(12) United States Patent
Matsuura

(10) Patent No.: US 9,985,238 B2
(45) Date of Patent: *May 29, 2018

(54) ELECTROLYTIC COPPER FOIL AND ELECTRONIC DEVICE

(71) Applicant: Mitsui Mining & Smelting Co., Ltd., Tokyo (JP)

(72) Inventor: Yoshinori Matsuura, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 216 days.

This patent is subject to a terminal disclaimer.

(21) Appl. No.: 14/655,434

(22) PCT Filed: Jul. 2, 2013

(86) PCT No.: PCT/JP2013/068138
§ 371 (c)(1),
(2) Date: Jun. 25, 2015

(87) PCT Pub. No.: WO2014/109081
PCT Pub. Date: Jul. 17, 2014

(65) Prior Publication Data
US 2015/0340639 A1    Nov. 26, 2015

(30) Foreign Application Priority Data
Jan. 9, 2013    (JP) ................. 2013-001895

(51) Int. Cl.
*H01L 51/52* (2006.01)
*H01L 51/42* (2006.01)
(Continued)

(52) U.S. Cl.
CPC ............ *H01L 51/5206* (2013.01); *C25D 1/04* (2013.01); *H01L 51/0097* (2013.01);
(Continued)

(58) Field of Classification Search
None
See application file for complete search history.

(56) References Cited

U.S. PATENT DOCUMENTS

| 8,791,565 B2 | 7/2014 | Matsuura et al. |
| 8,803,135 B2 | 8/2014 | Matsuura et al. |

(Continued)

FOREIGN PATENT DOCUMENTS

| JP | 2001345460 A | 12/2001 |
| JP | 2004111354 A | 4/2004 |

(Continued)

*Primary Examiner* — Seth Dumbris
(74) *Attorney, Agent, or Firm* — The Webb Law Firm

(57) ABSTRACT

Provided is an electrolytic copper foil significantly useful as electrodes for electronic devices. The electrolytic copper foil used for an electronic device according to the present invention includes copper or copper alloy, the electrolytic copper foil having a 0.2% proof stress of 250 N/mm2 or more after heat treatment at 200° C. for 60 min in a nitrogen atmosphere, wherein at least one of the surfaces of the electrolytic copper foil has a concave-dominant surface profile having a Pv/Pp ratio of 1.2 or more, the Pv/Pp ratio being a ratio of a maximum profile valley depth Pv to a maximum profile peak height Pp as determined in a rectangular area of 181 μm by 136 μm in accordance with JIS B 0601-2001.

13 Claims, 18 Drawing Sheets

(51) Int. Cl.
    *C25D 1/04*    (2006.01)
    *H01L 51/00*   (2006.01)
    *H01L 51/44*   (2006.01)
    *C25D 3/38*    (2006.01)
(52) U.S. Cl.
    CPC .......... *H01L 51/422* (2013.01); *H01L 51/424* (2013.01); *H01L 51/4293* (2013.01); *H01L 51/441* (2013.01); *H01L 51/5203* (2013.01); *C25D 3/38* (2013.01); *Y02E 10/549* (2013.01); *Y10T 428/12431* (2015.01)

(56) References Cited

U.S. PATENT DOCUMENTS

| | | |
|---|---|---|
| 8,816,338 B2 | 8/2014 | Matsuura et al. |
| 2001/0037825 A1 | 11/2001 | Nakano et al. |
| 2004/0017152 A1 | 1/2004 | Hashimoto et al. |
| 2006/0009133 A1 | 1/2006 | Hashimoto et al. |
| 2008/0118844 A1* | 5/2008 | Miyamoto ............ H01M 4/134 429/338 |
| 2011/0070461 A1 | 3/2011 | Yamada et al. |
| 2013/0069042 A1 | 3/2013 | Matsuura et al. |
| 2014/0017564 A1 | 1/2014 | Suzuki et al. |

FOREIGN PATENT DOCUMENTS

| | | |
|---|---|---|
| JP | 2008243772 A | 10/2008 |
| JP | 2009152113 A | 7/2009 |
| JP | 2011222819 A | 11/2011 |
| JP | 2012151106 A | 8/2012 |
| JP | 2012212675 A | 11/2012 |
| WO | 2009139495 A1 | 11/2009 |
| WO | 2011152091 A1 | 12/2011 |
| WO | 2011152092 A1 | 12/2011 |
| WO | WO2012091060 * | 7/2012 ............ H01M 4/66 |

* cited by examiner

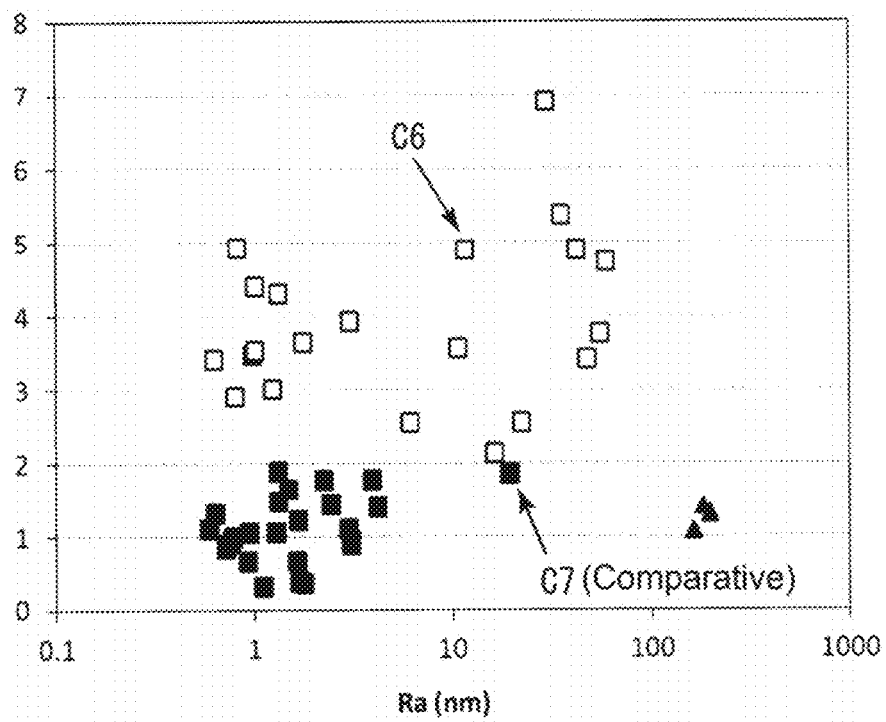

☐: Electrode foil samples exhibiting 1.2 or more times improved optical characteristics due to light scattering
■: Electrode foil samples exhibiting less than 1.2 times improved optical characteristics, although device characteristics are acceptable
▲: Electrode foil samples not exhibiting acceptable device characteristics due to short circuiting with a counter electrode

FIG. 24

ELECTROLYTIC COPPER FOIL AND ELECTRONIC DEVICE

CROSS-REFERENCE TO RELATED APPLICATION

This application is the United States national phase of International Application No. PCT/JP2013/068138 filed Jul. 2, 2013, and claims priority to Japanese Patent Application No. 2013-001895 filed on Jan. 9, 2013, the disclosures of which are hereby incorporated in their entirety by reference.

TECHNICAL FIELD

The present invention relates to an electrolytic copper foil and an electronic device including the electrolytic copper foil.

BACKGROUND ART

Light-emitting elements such as organic EL lighting devices have recently attracted attention as eco-friendly green devices. The organic EL lighting devices are characterized by 1) lower power consumption than incandescent lamps; 2) thin profile and light weight; and 3) flexibility. The organic EL lighting devices are now being developed to achieve the features 2) and 3). In this respect, glass substrates conventionally used in flat panel displays (FPD) or the like cannot achieve the features 2) and 3).

In this regard, researches have been conducted on a substrate as a support (hereinafter, referred to as "supporting substrate") for organic EL lighting devices, and ultra-thin glass plates, resin films, metal foils or the like have been proposed as candidate supporting substrates. The ultra-thin glass is superior in heat resistance, barrier performance, and optical transparency and has good flexibility, but is somewhat inferior in handleability and has low thermal conductivity and high material cost. The resin film is superior in handleability and flexibility and has low material cost and good optical transparency, but is inferior in heat resistance and barrier performance and has low thermal conductivity.

In contrast, the metal foil has excellent characteristics such as superior heat resistance, barrier performance, handleability, and thermal conductivity, good flexibility, and low material cost, except for absence of optical transparency. In particular, a typical flexible glass or film has a significantly low thermal conductivity of 1 W/m ° C. or lower, while a copper foil has a significantly high thermal conductivity of about 400 W/m ° C.

PTL 1 (JP2009-152113A) discloses formation of an organic layer on a surface of a metal substrate that is smoothed by polishing and/or plating in order to achieve a light-emitting element including the metal substrate. PTL 2 (JP2008-243772A) discloses formation of an organic EL element on a smooth surface of a nickel plating layer that is formed on a metal substrate without polishing or the like. Aside from these disclosures, a photoelectric element including a metal substrate is proposed; for example, PTL 3 (JP2011-222819A) discloses a solar cell with a thin organic electromotive layer provided on a smoothed metal substrate. In these techniques, however, the smoothing of the metal substrate is an important challenge for prevention of a short circuit between the electrodes. For addressing this challenge, PTL 4 (WO2011/152091) and PTL 5 (WO2011/152092) disclose metal foil having an ultra-smooth surface having an extremely low arithmetic mean roughness Ra of 10.0 nm or less that functions as both supporting substrates and electrodes.

Furthermore, an electrolytic copper foil for a lithium-ion secondary battery is known, which has a surface roughness Rz of 0.8 to 2.8 μm on both surfaces and a 0.2% proof stress of 250 N/mm² or more after heat treatment at 200 to 400° C. (see PTL 6 (JP2012-151106A)).

CITATION LIST

Patent Literature

PTL 1: JP2009-152113A
PTL 2: JP2008-243772A
PTL 3: JP2011-222819A
PTL 4: WO2011/152091
PTL 5: WO2011/152092
PTL 6: JP2012-151106A

SUMMARY OF INVENTION

The inventor has currently found that an electrolytic copper foil with a high 0.2% proof stress after heat treatment and a concave-dominant surface profile is significantly useful as electrodes for electronic devices.

Accordingly, it is an object of the present invention to provide an electrolytic copper foil significantly useful as electrodes for electronic devices.

According to an aspect of the present invention, there is provided an electrolytic copper foil for use as an electrode for an electronic device, the electrolytic copper foil comprising copper or copper alloy, wherein the electrolytic copper foil has a 0.2% proof stress of 250 N/mm² or more after heat treatment at 200° C. for 60 min in a nitrogen atmosphere, and wherein at least one of the surfaces of the electrolytic copper foil has a concave-dominant surface profile having a Pv/Pp ratio of 1.2 or more, the Pv/Pp ratio being a ratio of a maximum profile valley depth Pv to a maximum profile peak height Pp as determined in a rectangular area of 181 μm by 136 μm in accordance with JIS B 0601-2001.

According to another aspect of the present invention, there is provided an electronic device comprising an electrode foil composed of the electrolytic copper foil; and a semiconductor functional layer having semiconductor characteristics provided on an ultra-smooth surface of the electrode foil.

BRIEF DESCRIPTION OF DRAWINGS

FIG. 24 is a plot illustrating a relationship between the arithmetic mean roughness Ra and the Pv/Pp ratio in the electrode foils prepared in Example C2.

DESCRIPTION OF EMBODIMENT

Definitions

The definitions of terms as used herein are provided below.

The term "0.2% proof stress" refers to the stress that causes 0.2% permanent strain upon removal of the load in stress-strain diagram and is used as an alternative indicator of yield stress in the material which does not show yield phenomenon. The 0.2% proof stress herein can be measured in accordance with JIS Z 2241 (2011) after a rectangular test piece having a size of 12.5 mm×90 mm is taken from an electrolytic copper foil and the test piece is set in a commercial tensile tester, wherein the test piece has preferably grip portions of 20 mm in length on both ends of the strip for clamping to a tensile, leaving a measuring portion of substantially 50 mm in length. In the case where a rectangular test piece is taken from the rolled electrolytic copper foil, the test piece is cut such that the long- and short-side directions of the rectangular test piece match the machine direction (MD) and the transverse direction (TD), respectively, of the rolled electrolytic copper foil and the test sample is set in a tensile tester so as to be pulled in the machine direction (MD).

The "Pv/Pp ratio" of the sample surface is measured in a rectangular area of 181 μm by 136 μm in accordance with JIS B 0601-2001, the Pv/Pp ratio being the ratio of the maximum profile valley depth Pv to the maximum profile peak height Pp (of the primary profile). The maximum profile peak height Pp represents the height of a convex, while the maximum profile valley depth Pv represents the depth of a concave. The surface having a higher Pv/Pp ratio has a more concave-dominant surface profile. The maximum profile peak height Pp and the maximum profile valley depth Pv can be determined in accordance with JIS B 0601-2001 with a commercially available non-contact profilometer.

Electrolytic Copper Foil

Figure 1:
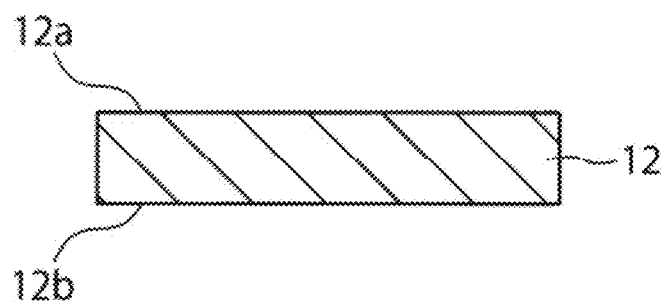
FIG. 1 is a schematic cross-sectional view illustrating an electrolytic copper foil of the present invention.

An electrolytic copper foil according to the present invention is used for an electrode for an electronic device. FIG. 1 shows a schematic cross-sectional view of an electrolytic copper foil of the present invention. The electrolytic copper foil 12 depicted in FIG. 1 is made of copper or copper alloy, having a front surface 12a and a back surface 12b. The electrolytic copper foil is relatively inexpensive and excellent in strength, flexibility, electrical properties, or the like.

The electrolytic copper foil 12 has a 0.2% proof stress of 250 N/mm² or more after heat treatment at 200° C. for 60 min in a nitrogen atmosphere (hereinafter, referred to as a 0.2% proof stress after heat treatment). At least one surface of the electrolytic copper foil 12 (i.e., the front surface 12a and/or the back surface 12b) has a concave-dominant surface profile having a Pv/Pp ratio of 1.2 or more, the Pv/Pp ratio being a ratio of a maximum profile valley depth Pv to a maximum profile peak height Pp as determined in a rectangular area of 181 µm by 136 µm in accordance with JIS B 0601-2001. The maximum profile peak height Pp represents the height of a convex, while the maximum profile valley depth Pv represents the depth of a concave. Accordingly, a Pv/Pp ratio of 1.2 or more represents a specific surface profile which comprises the concave portions dominant to the convex portions. Thus, an electrolytic copper foil with a high 0.2% proof stress after heat treatment and a concave-dominant surface profile is significantly useful as electrodes for electronic devices.

That is, a 0.2% proof stress of 250 N/mm² or more after heat treatment can effectively reduce waviness which may occur during steps involving heat in the production of electronic devices including an electrolytic copper foil as an electrode. For example, a continuous coating of organic semiconductor material on an electrolytic copper foil for preparation of an organic EL lighting device, an organic thin-film solar cell or the like is desirably performed together with annealing in succession by a series of roll-to-roll processes. This annealing, depending on the type of the organic semiconductor material, is generally carried out in a temperature range of 150 to 300° C. When annealed at 150° C. or more, however, currently used smooth copper foils are softened by recrystallization of the crystal grains. In particular, if the smooth copper foil requires a substrate function in addition to the electrode function, the softening of the smooth copper foil can induce waviness of the foil itself, leading to non-uniformity of the thickness of the organic semiconductor to be laminated, resulting in causing problems such as luminous spots in an electronic device on the foil. For example, the electrolytic copper foil, when heat-treated under a tension applied thereto, may undergo plastic deformation due to local recrystallization, sometimes causing a phenomenon called an undulation involving large waviness. Alternatively, the heat treatment may cause a phenomenon called flare, which is waviness or a wavy pattern on the edges of the copper foil. Such phenomena may adversely affect the thickness uniformity of the coating layer of an organic polymer material, causing problems as described above to the electronic device. Furthermore, a large flare may come into contact with a slit coater unit to scratch it. These problems are not limited to electrolytic copper foils in rolled form, but are also true for electrolytic copper foils in cut sheet form having a predetermined size. In the roll-to-roll process, the softening of the smooth copper foil may prevent accurate transport to induce winding displacement and winding wrinkle, resulting in lowering the yield. These various problems can be overcome or alleviated by allowing the copper foil to have a 0.2% proof stress of 250 N/mm² or more after heat treatment, and thus the reliability of electronic devices including such an electrolytic copper foil can be remarkably improved. The 0.2% proof stress after heat treatment is preferably 280 N/mm² or more, more preferably 300 N/mm² or more, still more preferably 350 N/mm² or more. The upper limit of the 0.2% proof stress after heat treatment is not particularly limited, but is preferably 1000 N/mm², more preferably 900 N/mm².

At least one surface of the electrolytic copper foil 12 (i.e., the front surface 12a and/or the back surface 12b) having a concave-dominant surface profile having a Pv/Pp ratio of 1.2 or more remarkably improves the reliability of electronic devices including such an electrolytic copper foil. This probably results from prevention of short circuit between electrodes (specifically short circuit between the foil and a counter electrode and short circuit between semiconductor functional layers) due to suppression of formation of the convex portions. The Pv/Pp ratio is preferably 1.5 or more, more preferably 2.0 or more, still more preferably 3.0 or more, especially preferably 4.0 or more, most preferably 5.0 or more. It is desirable for the Pv/Pp ratio to be as high as possible without any particular limitation, but the upper limit can be practically set at about 10.0 in terms of cost-effectiveness.

In particular, a concave-dominant surface profile having a Pv/Pp ratio of 2.0 or more can provide the electrolytic copper foil with superior light scattering ability. For this purpose, the Py/Pp ratio is preferably 2.3 or more, more preferably 2.5 or more, still more preferably 2.8 or more, particularly more preferably 3.0 or more. That is, according to the finding of the inventors, the electrolytic copper foil having such a specific concave-dominant surface profile can exhibit superior light scattering ability and thereby can exhibit improved light-emitting efficiency and power generation efficiency. This is probably resulted from light scattering caused by preferentially formed concave portions together with prevention of a short circuit between electrodes (specifically, a short circuit between the foil and a counter electrode and a short circuit between semiconductor functional layers) due to inhibition of formation of the convex portions as described above. In particular, in the electrode foil of the present invention, the light scattering effect, which is achieved by the surface profile itself of the metal foil or the electrode foil, can eliminate the formation of microlens and microfabrication associated therewith without impairment of productivity and cost effectiveness; therefore the electrode foil is also suitable for large-area devices.

Furthermore, the present inventors have found that a concave-dominant surface profile having a Pv/Pp ratio of 1.2 or more can provide the effect of inhibiting the oxidation of the electrolytic copper foil prepared or stored in a rolled state, for some reason. This oxidation inhibition effect can improve the suitability of the electrolytic copper foil as electrodes for electronic devices. That is, copper foil readily rusts, so that surface treatments such as organic anti-rust treatments, inorganic anti-rust treatments, and coupling treatments have been conducted. An organic rust inhibitor or the like present on a copper foil used for an electrode substrate, however, may cause adverse effects on the device characteristics or the like. If no anti-rust treatment is employed, the oxidation of the surface will proceed and may cause problems such as peeling of the reflective film and an increase in the electrical resistance of the device. Specifically, the copper foil wound in a roll for a roll-to-roll process is significantly oxidized. Such oxidation raises some problems especially in mass production of the electrode substrates for electronic devices. These problems can be overcome or alleviated by allowing at least one surface of the electrolytic copper foil 12 to have a concave-dominant surface profile having a Pv/Pp ratio of 1.2 or more, resulting in high reliability of electronic devices including such a copper foil. The Pv/Pp ratio is preferably 1.5 or more, more preferably 2.0 or more, still more preferably 3.0 or more, particularly preferably 4.0 or more, most preferably 5.0 or more.

The concave-dominant surface profile is preferably an ultra-smooth surface having an arithmetic mean roughness Ra of 10 nm or less, more preferably 7.0 nm or less, still more preferably 5.0 nm or less, particularly preferably 3.0 nm or less, determined in accordance with JIS B 0601-2001 and the appropriate roughness can be determined according to the applications or, characteristics, or the like required for the electrolytic copper foil. The arithmetic mean roughness Ra may have any lower limit; it may be 0 (zero), or 0.5 nm in view of the efficiency of surface smoothing treatment. The arithmetic mean roughness Ra can be determined in accordance with JIS B 0601-2001 with a commercially available surface roughness meter. The significantly small arithmetic mean roughness Ra of the concave-dominant surface profile as described above can further effectively prevent short circuit between the electrodes when used for an electronic device such as a light-emitting element and a photoelectric element. Such an ultra-smooth surface can be achieved by polishing the electrolytic copper foil by chemical mechanical polishing (CMP) treatment. CMP treatment can be performed with a known polishing solution and a known polishing pad under known conditions. A preferred polishing solution comprises one or more granular polishing agents selected from ceria, silica, alumina, and zirconia, and the like in an amount of from about 0.1 to about 10% by weight; a rust inhibitor such as benzotriazole (BTA); and/or an organic complex forming agent such as quinaldic acid, quinolinic acid, nicotinic acid, malic acid, amino acids, citric acid, carboxylic acid, or poly(acrylic acid); a surfactant such as a cationic surfactant or an anionic surfactant; and optionally an anticorrosive agent. A preferred polishing pad is composed of polyurethane. Adequately regulated polishing conditions such as a pad rotation rate, a work load, and a coating flow of polishing solution can be adopted without particular limitations. It is preferred that the rotational rate be controlled within the range of from 20 to 1,000 rpm, that the work load be controlled within the range of from 100 to 500 gf/cm$^2$, and that a coating flow of the polishing solution be controlled within the range of from 20 to 200 cc/min.

Alternatively, one surface of the electrolytic copper foil may have the concave-dominant surface profile and the other surface may be an ultra-smooth surface having an arithmetic mean roughness Ra of 10 nm or less. It is preferred that the electrolytic copper foil have a front surface 12a having an ultra-smooth surface profile having an Ra of 10 nm or less and a back surface 12b having a concave-dominant surface profile having a Pv/Pp ratio of 1.2 or more. Thus, such a double-side treated foil can suppress oxidation of the ultra-smooth surface more effectively and also prevent roll scratches when wound in a rolled state, in addition to prevention of a short circuit between the electrodes. Specifically, the electrolytic copper foil of the present invention is particularly suitable for an electrode substrate used for electronic devices in that it is possible to effectively suppress oxidation of the ultra-smooth surface for the formation of the elements without using organic rust inhibitors that may cause adverse effects on the device characteristics or the like. The mechanism of the oxidation inhibition effect is not clear in detail, but presumably involves several factors as follows. First, it is believed that the ultra-smooth metal surface having a Ra of 10 nm or less in concert with a uniform dense ultra-thin oxide film (e.g., several nm in thickness) on the metal surface inhibits further oxidation. The inhibited oxidation state can be confirmed through analysis of the surface of the electrolytic copper foil with an X-ray photoelectron spectroscopic (XPS) system, which can acquire the information on a depth less than 10 nm from the surface. Consequently, a peak due to unoxidized metal copper within the measurable depth is detected in the case where only an ultra-thin oxide film of less than the measurable depth is formed on the surface of the electrolytic copper foil. Second, it is believed that the inhibited oxidation as described above can reduce the frequency and intensity of contact of unoxidized copper with the oxides in a rolled state of the foil when the front and the back surfaces come into contact with each other, resulting in inhibition of further growth of the oxides. This is because the contact of the metal with the oxides can enhance the oxidation of the original unoxidized metal portions by exposing them to an oxidizing environment. Third, it is presumed that air is less likely to enter a gap between the front and the back surfaces due to the specific profiles of the ultra-smooth surface and the concave-dominant surface of the electrolytic copper foil, thereby enhancing the oxidation inhibition effect. In any case, the oxidation inhibition effect thus achieved by the double-side treated electrolytic copper foil has been unexpected, and can eliminate conventional anti-rust treatments, such as application of organic rust inhibitors, which may cause adverse effects on the device characteristics or the like, from the surface of the foil. Furthermore, with regard to the problem that roll scratches are likely to occur when the copper foil is wound in a rolled state, the controlled surface profiles of the both surfaces (especially the back surface which tends to have a high roughness) can reduce the roll scratches when wound in a roll. This result is achieved effectively by setting the Pv/Pp of the back surface to be 1.5 or more.

Each surface of the electrolytic foil 12 has preferably the concave-dominant surface profiles. That is, the electrolytic copper foil 12 having a concave-dominant back surface 12b and a concave-dominant front surface 12a can prevent roll scratching more effectively when wound in a roll. This result is achieved effectively by setting the Pv/Pp of the back surface to be 1.5 or more.

The ultra-smooth metal surface having a Ra of 10 nm or less can be achieved by polishing electrolytic copper foil by electrolytic polishing, buff polishing, chemical polishing, a combination thereof, or the like. The chemical polishing can be carried out without particular limitation under appropriately controlled conditions, for example, the type of a chemical polishing solution, the temperature of the chemical polishing solution, the dipping time in the chemical polishing solution. For example, a mixture of 2-aminoethanol and ammonium chloride can be used for chemical polishing of copper foil. The temperature of the chemical polishing solution is preferably room temperature, and a dipping method (Dip process) is preferably used. Furthermore, the preferred dipping time in the chemical polishing solution ranges from 10 to 120 sec, more preferably from 30 to 90 sec since long dipping time often results in loss of the smoothness. The electrolytic copper foil after chemical polishing is preferred to be washed with running water. Such smoothing treatment can smooth the surface from an original arithmetic mean roughness Ra of about 12 nm to a final roughness of 10.0 nm or less, for example, about 3.0 nm.

The ultra-smooth surface may also be achieved by polishing the surface of the electrolytic copper foil 12 by blasting; or melting the surface of the electrolytic copper foil by a technique such as laser, resistance heating, or lamp heating followed by rapid-quenching.

Even if the surface is merely ultra-smoothed like an ultra-smooth surface, a Pv/Pp ratio of 1.2 or more usually cannot be achieved since concave portions and convex portions are generally formed to a similar extent. Accordingly, it is preferred that the process for providing the Pv/Pp ratio of 1.2 or more be carried out. Preferable examples of the surface treatment include an ultrasonic cleaning, a chemical polishing using a chemical polishing liquid and/or a dry-ice blasting method. The ultrasonic cleaning may be performed, for example, using a commercially available running water-type ultrasonic cleaner, by treating the electrolytic copper foil surface with a predetermined high frequency output (e.g., 60 W) for a predetermined time (e.g., 10 min). The chemical polishing may be performed, for example, using a chemical polishing solution (e.g., a polishing solution for pure copper such as CPB-10, manufactured by MITSUBISHI GAS CHEMICAL COMPANY, INC.), by mixing the polishing solution with water at a predetermined proportion (e.g., a weight proportion of 1:2) before immersing at room temperature for 1 minute and by performing cleaning with pure water, cleaning with dilute sulfuric acid (e.g., 0.1 N dilute sulfuric acid), cleaning with pure water once again and drying. Alternatively, the electrolytic copper foil may be immersed in 1 mass % hydrogen peroxide solution and then washed with ultrapure water. The dry-ice blasting method can be performed, for example, with a commercially available apparatus such as a dry-ice snow system (manufactured by Air WATER INC.), which sprays carbon dioxide solidified at low temperature against the back surface 12b by ejecting carbon dioxide gas compressed at high pressure through a fine nozzle. In the step of electrodeposition of an electrolytic copper foil, a surface profile of the electrolytic copper foil can be controlled by appropriate adjustment of the quantity of additives such as organic substances and chlorine, if they are added. In this case, any post-treatment (e.g., the ultrasonic cleaning, chemical polishing, dry-ice blasting treatment, and CMP treatments) may be appropriately selected depending on the surface smoothness of the resulting electrolytic copper foil.

The electrolytic copper foil may have any thickness which allows the metal foil to retain sufficient flexibility and be handled alone as a foil. The thickness may be in the range of from 1 to 250 µm, preferably from 5 to 200 µm, more preferably from 10 to 150 µm, and most preferably from 15 µm to 100 µm and may be appropriately determined according to the applications, the characteristics, or the like required for the electrode foil. Accordingly, if further reductions in the amount and weight of the metal are required, the upper limit of the thickness is preferably 50 µm, 35 µm, or 25 µm, while if further strength is required, the lower limit of the thickness is preferably 25 µm, 35 µm, or 50 µm. An electrolytic copper foil with such a thickness can be cut readily with a commercially available cutting machine. Unlike glass substrates, the electrolytic copper foil does not have disadvantages such as cracking and chipping, but has an advantage of not easily generating particulate matter during cutting or the like. The electrolytic copper foil may be formed into various shapes, such as circle, triangle, and polygon, other than tetragon, and can also be cut and pasted to fabricate electronic devices with a three-dimensional shape, such as a cubic shape or a spherical shape since the electrolytic copper foil can be cut and welded. In this case, it is preferred that a semiconductor functional layer be not formed at a cutting or welding portion of the electrolytic copper foil.

The electrolytic copper metal of the present invention may have any length, and preferably have a length enough to be applicable to a roll-to-roll process. The length of the electrolytic copper foil, which depends on the specifications or the like of the device, is preferably at least about 2 m, and from the viewpoint of productivity, more preferably at least 20 m, still more preferably at least 50 m, particularly preferably at least 100 m, most preferably at least 1000 m. Furthermore, the electrolytic copper foils may be cut into a sheet form having a predetermined size. The width of the electrolytic copper foil which depends on the specifications or the like of the device is preferably at least about 150 mm, and from the viewpoint of productivity, more preferably at least 350 mm, still more preferably at least 600 mm, particularly preferably at least 1000 mm. As described above, the electrolytic copper foil of the specific embodiment of the present invention is effectively prevented from scratches which may occur during a winding operation, and thereby does not require any measures against roll scratches, for example, providing more resilient material than the electrode foil, such as a film or embossed film interposed between the front and back surfaces, resulting in simplification of handling of the electrolytic copper foil.

The ultra-smooth surface and concave-dominant surface are preferably washed with an alkaline solution. A known alkaline solution, such as an ammonia-containing solution, a sodium hydroxide solution, and a potassium hydroxide solution can be used. The alkaline solution is preferably an ammonia-containing solution, more preferably an organic alkaline solution containing ammonia, most preferably a tetramethylammonium hydroxide (TMAH) solution. The preferred concentration of the TMAH solution ranges from 0.1 to 3.0 wt %. An example of the washing described above involves washing at 23° C. for one minute with a 0.4% TMAH solution. A similar washing effect can also be attained by UV (Ultra Violet) treatment in combination with or in place of the washing with the alkaline solution. Furthermore, oxides formed on the surface of, for example, copper foil can be removed with an acidic washing solution such as dilute sulfuric acid. An example of the acid washing involves washing for 30 sec with dilute sulfuric acid.

It is preferred that particles on the ultra-smooth surface and concave-dominant surface be removed. Examples of effective removal techniques of particles include sonic washing with ultra-pure water and dry-ice blasting. Dry-ice blasting is more effective. The dry-ice blasting involves ejecting highly compressed carbon dioxide gas through a fine nozzle and thereby squirting the ultra-smooth surface 12a with carbon dioxide solidified at low temperature to remove the particles. Unlike wet processes, the dry-ice blasting has advantages of no drying process, readily removable organic substances, or the like. The dry-ice blasting can be performed with a commercially available apparatus, such as a dry-ice snow system (manufactured by AIR WATER INC.). When the particles have been already removed by such treatment to provide a Pv/Pp ratio of 1.5 or more (e.g., the dry-ice blasting method), this particle removal process can be omitted.

Electrode Foil

Figure 2:
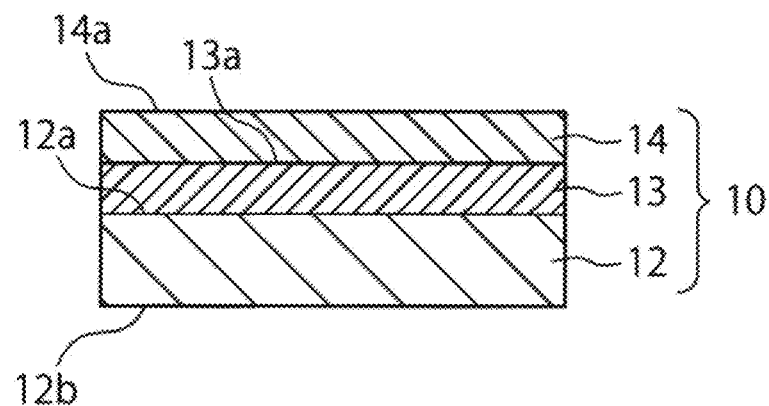
FIG. 2 is a schematic cross-sectional view illustrating an exemplary electrode foil including an electrolytic copper foil of the present invention.

The electrolytic copper foil of the present invention is preferably used alone or in a lamination with one or other functional layers as an electrode foil. FIG. 2 is a schematic cross-sectional view illustrating an electrode foil 10. The electrode foil 10 shown in FIG. 2 comprises an electrolytic copper foil 12. The electrode foil 10 may optionally comprise a reflective layer 13 provided directly on the surface 12a of the electrolytic copper foil 12, or on an antidiffusion layer provided on the surface 12a. Furthermore, the electrode foil 10 may optionally include a buffer layer 14 provided directly on the ultra-smooth surface 12a of the electrolytic copper foil 12 or on the surface 13a of the reflective layer 13, if present. Although the electrode foil 10 shown in FIG. 2 has a triple-layer structure composed of the electrolytic copper foil 12, the reflective layer 13, and the buffer layer 14, the electrode foil of the present invention is not limited thereto but may be a single-layer structure composed of the electrolytic copper foil 12 or a double-layer structure composed of the electrolytic copper foil 12 and the reflective layer 13. Alternatively, it may be a quintuple-layer structure composed of the reflective layers 13 and the buffer layers 14 provided on both sides of the electrolytic copper foil 12.

Thus, use of the electrolytic copper foil 12 as a supporting substrate and an electrode provides an electrode foil which functions as both a supporting substrate and an electrode. Particularly, the electrolytic copper foil 12 having a thickness in an appropriate range (preferably 1 to 250 µm) can be used as an electrode functioning as a supporting substrate for a flexible electronic device. In production of such a flexible electronic device, the electrode foil 12 of the present invention can be manufactured efficiently, for example, by a roll-to-roll process without a particular supporting substrate because the electrode foil 12 is based on electrolytic copper foil. The roll-to-roll process is a significantly advantageous process in terms of efficient mass production of electronic devices, in which a long foil is wound off a roll, subjected to a predetermined process and rewound; therefore the roll-to-roll process is a key process to achieve mass production of electronic devices such as a light-emitting element and a photoelectric element, which belong to the application field of the present invention. Thus, the electrode foil of the present invention does not require a supporting substrate or a reflecting layer. The electrode foil of the present invention, therefore, has preferably no insulating layer at least on a portion where the electronic device is to be disposed, and more preferably no insulating layers on any portion.

The reflective layer 13 may be optionally provided directly on the surface 12a of the electrolytic copper foil 12 or on an antireflective layer provided on the surface 12a. The reflective layer 13 is preferably composed of at least one metal or alloy selected from the group consisting of aluminum, aluminum alloys, silver, and silver alloys. These materials are suitable for a reflective layer due to high optical reflectivity and thin films formed thereof also have excellent smoothness. In particular, inexpensive aluminum or aluminum alloys are preferred. It is possible to adopt a wide variety of aluminum alloys and silver alloys having conventional alloy compositions as used for an anode or a cathode of a light-emitting element or a photoelectric element. Preferred examples of the aluminum alloy compositions include Al—Ni; Al—Cu; Al—Ag; Al—Ce; Al—Zn; Al—B; Al—Ta; Al—Nd; Al—Si; Al—La; Al—Co; Al—Ge; Al—Fe; Al—Li; Al—Mg; Al—Mn; and Al—Ti. Any element that constitutes these alloys may be combined thereof, depending on required characteristics. Preferred examples of the silver alloy compositions include Ag—Pd; Ag—Cu; Ag—Al; Ag—Zn; Ag—Mg; Ag—Mn; Ag—Cr; Ag—Ti; Ag—Ta; Ag—Co; Ag—Si; Ag—Ge; Ag—Li; Ag—B; Ag—Pt; Ag—Fe; Ag—Nd; Ag—La; and Ag—Ce. Any element that constitutes these alloys may be combined thereof, depending on required characteristics. The reflective layer 13 can have any thickness; and preferably has a thickness of 30 to 500 nm, more preferably 50 to 300 nm, and most preferably 100 to 250 nm.

The reflective layer 13, in the case of being composed of an aluminum film or an aluminum alloy film, can have a laminate structure including at least two layers. In the above embodiment, the reflective layer 13 has a laminate structure of two layers which are separated from each other by an interface, across which the lower layer and the upper layer have different crystal orientations. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the heat resistance of the electrode foil can be improved. Accordingly, the above embodiment is particularly effective in heat treatment which is performed at a temperature of 200° C. or higher, preferably 230° C. or higher, and more preferably 250° C. or higher after the hole injection layer is coated. The improved heat resistance is probably due to blocking the thermal migration preferential in crystal boundaries by the interfaces where the crystal boundaries discontinue. The number of the interfaces in the reflective layer 13 may be two or more, which means that the reflective layer is a laminate structure of three or more layers.

The antidiffusion layer optionally provided between the electrolytic copper foil 12 and the reflective layer 13 can be any layer that has a function of preventing diffusion of metal from the electrolytic copper foil and can employ various known compositions and structures. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the heat resistance of the electrode foil can be enhanced. Accordingly, the above embodiment is particularly effective in heat treatment which is performed at a temperature of 200° C. or higher, preferably 230° C. or higher, and more preferably 250° C. or higher after the hole injection layer is coated. The antidiffusion layer may have a layer structure composed of two or more sublayers.

It is preferred that the buffer layer 14 be provided directly on the surface of at least one of the electrolytic copper foil 12 and the reflective layer 13, if present, and the surface of the buffer layer be the light-scattering surface. In the light-emitting element or the photoelectric element, the buffer layer 14 can be any layer that can provide a desired work function after coming into contact with a semiconductor functional layer. The buffer layer in the present invention is preferably transparent or translucent to ensure high light scattering effect.

The buffer layer 14 is preferably at least one selected from the group consisting of an conductive amorphous carbon film, an conductive oxide film, a magnesium alloy film, and a fluoride film, and may be selected as needed depending on applications such as an anode or a cathode of the electronic device and required performances.

The electrolytic copper foil or electrode foil of the present invention can be preferably used as an electrode (i.e., anode or cathode) for various electronic devices. The electrode foil of the present invention, which can be readily bent at low stress, is particularly preferably used as an electrode for flexible electronic devices, and it may also be used for less flexible or more rigid electronic devices. Examples of the electronic devices (mainly flexible electronic devices) include i) light-emitting elements (e.g., an organic EL element, an organic EL lighting device, an organic EL display, an electronic paper display, a liquid crystal display, an inorganic EL element, an inorganic EL display, LED lighting device, and LED display; ii) photoelectric elements (e.g., a thin film solar cell); preferably an organic EL element, an organic EL lighting device, an organic EL display, an organic solar cell, and a dye-sensitized solar cell, and more preferably an organic EL lighting device because it is significantly thin and emits light of high luminance. The electrode foil of the present invention can be preferably used for an anode or a cathode of the organic solar cell because many characteristics required for the electrode of the organic solar cell are in common with those of the organic EL element. Accordingly, appropriate selection of the type of an organic semiconductor functional layer to be laminated on the electrode foil of the present invention in accordance with known techniques makes it possible to construct an organic device as any one of the organic EL element and the organic solar cell.

The both surfaces of the electrolytic copper foil or the electrode foil of the present invention may have an ultra-smooth surface profile. This is advantageous for providing electronic devices on the both surfaces of the electrode foil, and thereby a double-sided functional element or a double-sided functional element foil comprising the electronic devices on the both surfaces can be provided. Furthermore, the present invention enables formation of a light-emitting element on one side and a power-generating element on the other side of the same electrode, which configuration provides a novel composite electronic device that has combined functions of the organic EL element and the organic solar cells. Furthermore, the electrode foil of the present invention can be used for not only the electrode of the organic EL element, but also a mounting substrate for the LED. In particular, the electrode foil of the present invention can be preferably used as an anode or a cathode for the LED lighting device since the LED elements can be densely mounted thereon.

Electronic Device

The electrolytic copper foil or the electrode foil including the electrolytic copper foil of the present invention can provide an electronic device comprising a semiconductor functional layer having semiconductive properties provided on the light-scattering surface of the electrode foil, and preferably comprising the semiconductor functional layer provided directly on the light-scattering surface. The semiconductor functional layer may be of any material and structure having semiconductor characteristics that can exhibit the desired functions on the electrode or between the electrodes. An organic semiconductor, an inorganic semiconductor, or mixtures or combinations thereof are preferred. For example, the semiconductor functional layer preferably has a function of excited luminescence or photoexcited power generation, so that the electronic device can function as a light-emitting element or a photoelectric element. Furthermore, the light-emitting element and the photoelectric element are preferably provided with a transparent or translucent counter electrode on the semiconductor functional layer. The process of dissolving a polymer material or a low molecular material in such a solvent as chlorobenzene and applying the solution is preferably applicable to the process of forming the semiconductor functional layer on the electrode foil of the invention, and an in-line vacuum process, which is suitable for improving productivity, is also applicable. As described above, the semiconductor functional layer may be provided on both sides of the electrode foil.

(1) Organic EL Element and Organic EL Lighting Device

A light-emitting element or an organic EL lighting device which is provided with a top-emission organic EL element on the light-scattering surface can be constructed with the electrode foil of the present invention as a reflective electrode.

Figure 3:
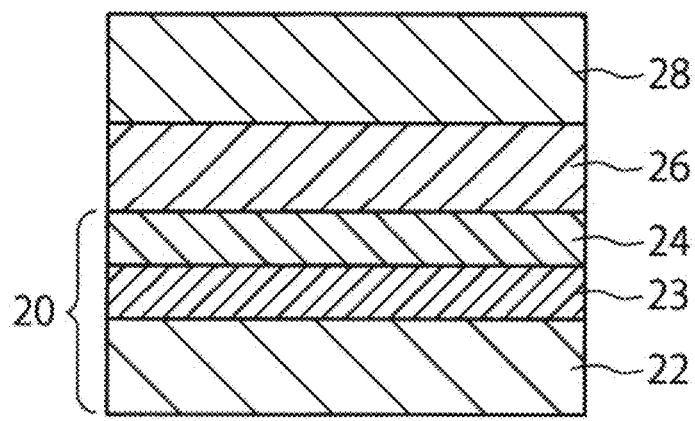
FIG. 3 is a schematic cross-sectional view illustrating an exemplary organic EL element including an anode of the electrolytic copper foil of the present invention.

FIG. 3 shows an example layer structure of a top-emission EL element that includes the electrode foil of the present invention as an anode. The organic EL element depicted in FIG. 3 comprises an anodic electrode foil 20 comprising an electrolytic copper foil 22, reflective layers 23 and optionally buffer layers 24; organic EL layers 26 provided directly on the buffer layer 24; and cathode 28 as light-transmitting electrodes provided directly on the organic EL layer 26. The buffer layer 24 is preferably composed of a conductive amorphous carbon film or a conductive oxide film suitable for an anode.

The organic EL layer 26 may have various known EL layer structures used for organic EL elements and may comprise optionally a hole injection layer and/or a hole transport layer, a light-emitting layer, and optionally an electron transport layer and/or an electron injection layer in this order from the anodic electrode foil 20 to the cathode 28. Any known structure or composition may be appropriately applied to each of the hole injection layer, the hole transport layer, the light-emitting layer, the electron transport layer, and the electron injection layer, without any particular limitation.

Figure 4:
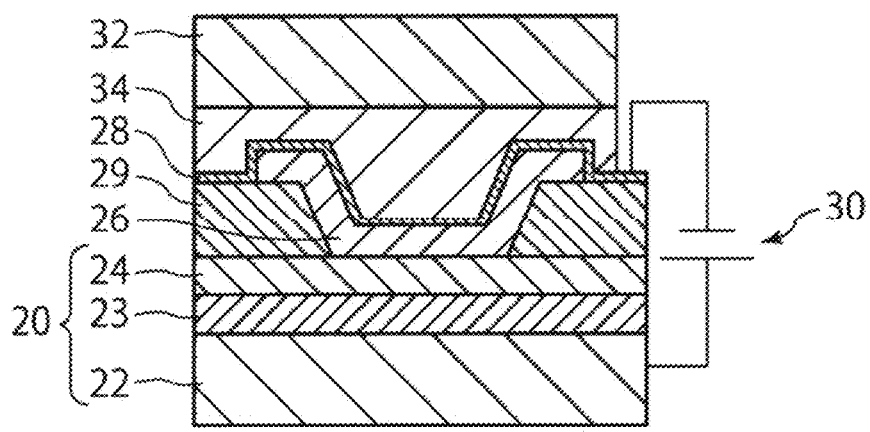
FIG. 4 is a schematic cross-sectional view illustrating an exemplary top-emission type organic EL lighting device of the present invention.

FIG. 4 illustrates an example layer structure of a top-emission organic EL lighting device incorporating organic EL elements depicted in FIG. 3. In the organic EL lighting device depicted in FIG. 4, the organic EL element is electrically connectable with a power source 30 through the electrolytic copper foil 22 of the anodic electrode foil 20. The surface area, not in contact with the organic EL layer 26, of the buffer layer 24 is covered with an interlayer insulating film 29. The interlayer insulating film 29 is preferably a Si-based insulating film formed by CVD, more preferably a SiN-based insulating film, which exhibits high barrier properties against water and oxygen that cause degradation of organic layers. A more preferred film is a SiNO-based insulating film, which has small internal stress and high flexibility.

Sealing materials 32 is disposed above the cathode 28 of the organic EL element. The gap between the sealing material 32 and the cathode 28 is filled with a sealing resin to form a sealing film 34. The sealing material 32 may be composed of a glass sheet or a film. In the case of a glass sheet, the sealing material 32 may be bonded directly onto the sealing film 34 using a hydrophobic adhesive tape. In the case of a film, both surfaces and end faces thereof may be covered with a Si-based insulating film. If a film having high barrier properties is developed in future, sealing suitable for mass production would be possible without such coating treatment. Although films having high flexibility are preferable as the sealing material 32, the required performance can be achieved with a sealing material formed of a film bonded to a significantly thin glass sheet having a thickness of 20 to 100 μm.

The cathode 28 may be composed of any of known transparent or translucent materials used in top-emission organic EL elements requiring light transmission. Materials having low work functions are preferred. Examples of the material for preferable cathodes include conductive oxide films, magnesium alloy films, and fluoride films. A combination of two or more layers of these materials is more preferred. The usable films are similar to those described for the buffer layer of the electrode foil.

A particularly preferable cathode has a double-layer laminated structure including a translucent metal layer as a buffer layer composed of a magnesium alloy film and/or a fluoride film and a transparent oxide layer as a cathode layer composed of a conductive oxide film. This structure is highly useful in terms of resistance characteristics. In this case, a high optical transparency and a low work function can be provided by bringing the translucent metal layer (buffer layer) of the cathode 28 into contact with the organic EL layer 26, resulting in enhanced brightness and power efficiency of the organic EL element. The most preferred example is a laminated cathode structure of a transparent oxide layer (cathode layer) composed of indium zinc oxide (IZO) and a translucent metal layer (buffer layer) composed of Mg—Ag. Furthermore, the cathode structure may have two or more transparent oxide layers and/or two or more translucent metal layers. Thus, the light generated in the organic EL layer 26 passes through the cathode 28, the sealing film 34, and then the sealing material 32 to be emitted to the outside.

On the back surface of the electrode foil 20, an auxiliary substrate may be appropriately provided depending on the type of application. Since this portion does not affect light emission performance, any material may be selected with a high degree of freedom. For instance, a resin film, such as poly(ethylene terephthalate) (PET), polyimide (PI), polycarbonate (PC), polyethersulfone (PES), and polyethernitrile (PEN), can be appropriately used due to its flexibility.

Figure 5:
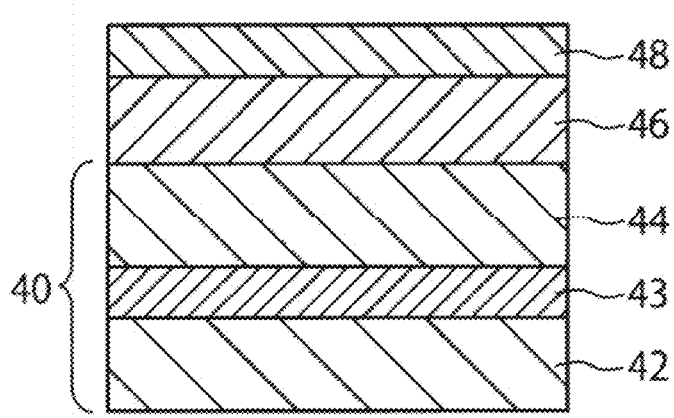
FIG. 5 is a schematic cross-sectional view illustrating an exemplary organic EL element including a cathode of the electrolytic copper foil of the present invention.

FIG. 5 illustrates an example layer structure of a top-emission organic EL element including the electrode foil of the present invention as a cathode. The organic EL element depicted in FIG. 5 includes a cathodic electrode foil 40 comprising an electrolytic copper foil 42, reflective layers 43 and buffer layers 44; organic EL layers 46 provided directly on the buffer layer 44; and anodes 48 as counter electrodes provided directly on the organic EL layer 46. The organic EL layer 46 may have a configuration similar to the organic EL layer 26 depicted in FIG. 3. The buffer layer 44 may also have a configuration similar to the cathode 28 depicted in FIG. 3, and preferably composed of a conductive oxide film, a magnesium alloy film, a fluoride film, or a combination of two or more layers thereof. More preferably, the buffer layer 44 is a translucent metal layer composed of a magnesium alloy film and/or a fluoride film.

More specifically, the organic EL element including the cathodic electrode foil 40 depicted in FIG. 5 corresponds to a structure of the organic EL element including the anodic electrode foil 20 depicted in FIG. 3, except that the buffer layers 24 and the cathodes 28 are interchanged, respectively, and the order of the layers from the anodes inside the organic EL layer 26 to the cathodes is inverted. In a preferred embodiment, a magnesium alloy film or a fluoride film as the buffer layer 44 of the cathodic electrode foil 40 is formed by sputtering or vapor deposition while a film composed of conductive amorphous carbon, $MoO_3$, or $V_2O_5$ as the anode 48 is formed by vapor deposition. In particular, a conductive amorphous carbon film is preferably formed on the organic EL layer by vacuum deposition to avoid plasma damaging during sputtering.

(2) Photoelectric Element

A photoelectric element may be formed on the light-scattering surface of the electrode foil of the present invention as a reflective electrode. The photoelectric element according to a preferable embodiment of the present invention includes an electrode foil, a photoexcitation layer as a semiconductor functional layer provided directly on the surface of the electrode foil, and a light-transmitting counter electrode provided directly on the surface of the photoexcitation layer. The photoexcitation layer may have various structures and may be composed of materials which are known as semiconductor functional layers of photoelectric elements.

For example, the organic EL layer 26 depicted in FIG. 3 may be replaced with a known organic solar cell active layer to construct an organic solar cell. The organic solar cell including the electrode foil of the present invention as an anode can be configured by depositing on a buffer layer (e.g., a carbon buffer layer), a hole transport layer (PEDOT:PSS (30 nm)), a p-type organic semiconductor functional layer (e.g., BP (benzoporphyrin)), an i-type mixing layer (e.g., BP:PCBNB (fullerene derivative)) of an n-type organic semiconductor and a p-type organic semiconductor, an n-type organic semiconductor layer (e.g., PCBM (fullerene derivative)), a buffer layer having a low work function (e.g., Mg—Ag), and a transparent electrode layer (e.g., IZO) in this order. Furthermore, in another example, the electrolytic copper foil (e.g., a copper foil) has a reflective layer (e.g., an aluminum film) and an n-type semiconductor buffer layer (e.g., an n-type oxide semiconductor such as ZnO, $SnO_2$, $TiO_2$, NbO, $In_2O_3$, $Ga_2O_3$ and combinations thereof), and the solar cell may be constructed by laminating a blend layer (e.g., P3HT:PCBM) of a p-type organic semiconductor and an n-type organic semiconductor, a hole transport layer (e.g., PEDOT:PSS) and an electrode in this order, on the n-type semiconductor buffer layer. Known materials may be appropriately used for these layers without any particular limitation. The electrode used for organic solar cells may be composed of the same materials and may have the same structures as an electrode used for organic EL elements. The electrode foil of the present invention comprises a reflective layer, which will increase the power generation efficiency by light confinement due to cavity effect.

The photoexcitation layer is composed of various known functional sublayers. These sublayers may be laminated from the electrode foil to the counter electrode in order. Alternatively, a first laminated portion of the electrode foil side and a second laminated portion of the counter electrode side may be separately prepared and then the first and the second laminated parts are bonded together to produce a photoelectric element including a desired photoexcitation layer.

EXAMPLES

The present invention will be further described in detail with reference to the following examples.

Example A1: Preparation and Evaluation of Various Surface-Treated Copper Foils (1) Preparation and Evaluation of Samples Samples A1 to A3 of electrode foil having various proof stresses after heat treatment and Pv/Pp ratios were prepared. Then, methods of measuring the surface properties of samples were as follows.

(Arithmetic Mean Roughness Ra)

The arithmetic mean roughness Ra of each sample surface was determined with a scanning probe microscope (Nano Scope V, manufactured by Veeco Instrument Inc.) in accordance with JIS B 0601-2001. This measurement was performed in an area of 10 μm square using a Tapping Mode AFM.

(Pv/Pp Ratio)

The maximum profile valley depth Pv to the maximum profile peak height Pp was determined with a non-contact profilometer (NewView5032, manufactured by Zygo Corp.) in a rectangular area of 181 μm by 136 μm in accordance with JIS B 0601-2001 to calculate a Pv/Pp ratio. Then, the specific measurement condition and filtering condition were as follows.

Lens: 50×
ImageZoom: 0.8×
Measured area: 181 μm by 136 μm
Filter High: Automatic
Filter Low: Fixed (150 μm)

(0.2% Proof Stress)

A test piece having a size of 12.5 mm×90 mm is taken from the rolled electrolytic copper foil such that the long side and short side of the rectangular test pieces match the machine direction (MD) and the transverse direction (TD), respectively, of the rolled electrolytic copper foil. The test piece is fixed to a tensile tester (Instron Corp., Model 1122) so as to be pulled in the machine direction (MD) and the 0.2% proof stress was measured in accordance with JIS Z 2241 (2011). The test piece had grip portions of 20 mm in length on both ends of the strip for clamping to a tensile tester such that the measuring portion was substantially 50 mm in length.

(Sample A1: Low Proof Stress Foil after Heat Treatment (Comparative))

Figure 6:
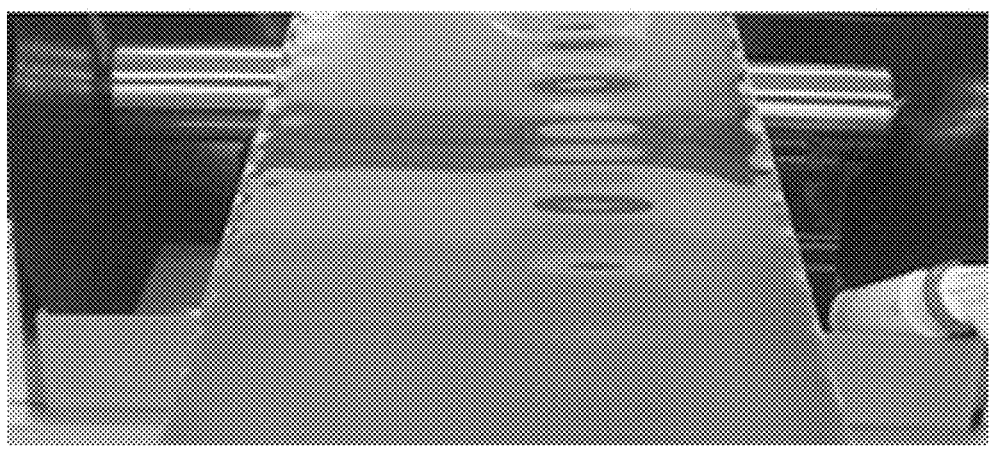
FIG. 6 is a photograph of entire Sample A1 taken out from the CMP processing step in a roll-to-roll process in Example A1.
Figure 7:
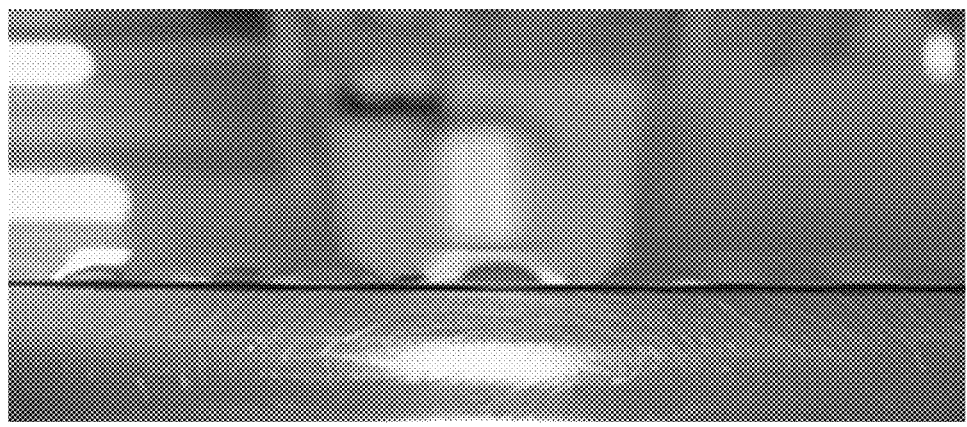
FIG. 7 is a photograph of an end portion of Sample A1 taken out from the CMP processing step in a roll-to-roll process in Example A1.

A low proof stress foil after heat treatment as a comparative embodiment of the present invention was prepared as follows. Sulfuric acid based aqueous copper sulfate solution containing 1.40 g/L of sulfuric acid and 80 g/L of copper was prepared. The aqueous copper sulfate solution was used to prepare an electrolyte solution containing sodium 3-mercapto-1-propanesulfonate (20 ppm), glue (10 ppm), and chlorine (30 ppm). From the electrolyte solution kept at 60° C., an electrolytic copper foil having a thickness of 35 μm, a width of 300 mm, and a length of 100 m was electrodeposited at an electrolytic current density of 40 A/dm$^2$. The electrolytic copper foil was produced as follows: the sulfuric acid-based electrolyte solution was circulated with a liquid pump between a rotating drum cathode made of titanium and an anode disposed along the shape of the rotating drum cathode so as to face it and an electrolytic current was applied, so that copper was deposited on the drum. The deposited copper foil having a predetermined thickness was detached from the drum and was rolled up continuously. The plated surface of the electrolytic copper foil had an Ra of 82 nm and the foil had a 0.2% proof stress of 396 N/mm$^2$ measured in a normal state. The surface of the copper foil was then subjected to a CMP process using a polishing machine manufactured by MAT Inc. This CMP treatment was performed for 60 sec with a polishing pad having XY grooves and a colloidal silica polishing solution under the conditions of a pad rotation rate of 50 rpm; a load of 170 gf/cm$^2$, and a liquid supply rate of 30 cc/min. The surface of the copper foil was thereby polished into an ultra-smooth surface. Sample A1 after CMP process had a Pv/Pp ratio of 1.5 and an Ra of 3.1 nm. The 0.2% proof stress, after annealing at 200° C. in a nitrogen atmosphere for 60 min, was measured three times. The results were 233, 220, and 204 mm$^2$, respectively. The electrolytic copper foil, taken out from the CMP processing step in a roll-to-roll process, was observed. Undulations were found in the foil center as shown in FIG. 6 and flares at the end of the foil as shown in FIG. 7.

(Sample A2: High Proof Stress Foil after Heat Treatment)

Figure 8:
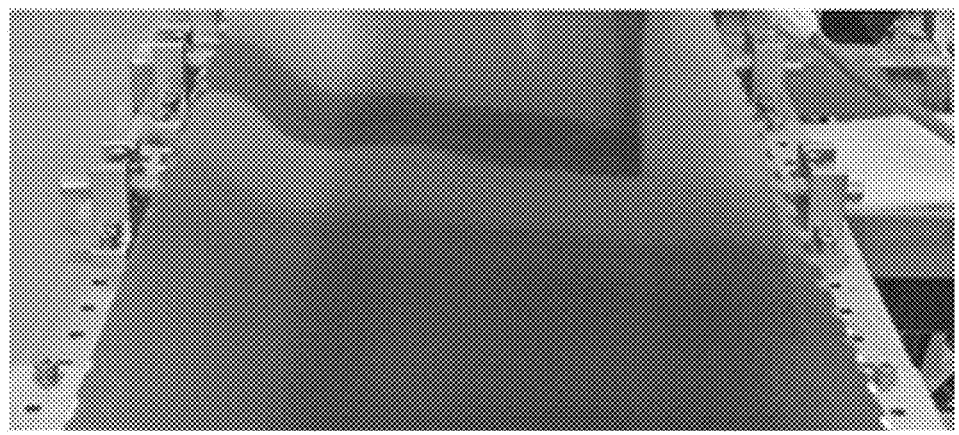
FIG. 8 is a photograph of entire Sample A2 taken out from the CMP processing step in a roll-to-roll process in Example A1.
Figure 9:
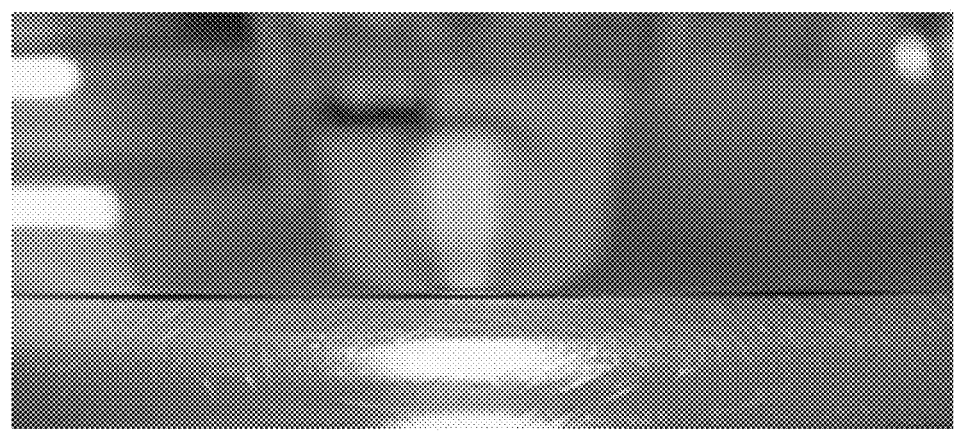
FIG. 9 is a photograph of an end portion of Sample A2 taken out from the CMP processing step in a roll-to-roll process in Example A1.

A high proof stress foil after heat treatment of the present invention was prepared as follows. Sulfuric acid based aqueous copper sulfate solution containing 140 g/L of sulfuric acid and 80 g/L of copper was prepared. The aqueous copper sulfate solution was used to prepare an electrolyte solution containing sodium 3-mercapto-1-propanesulfonate (20 ppm), diallyldimethylammonium chloride (15 ppm), and chlorine (30 ppm). From the electrolyte solution kept at 60° C., an electrolytic copper foil having a thickness of 35 μm, a width of 300 mm, and a length of 100 m was electrodeposited at an electrolytic current density of 60 A/dm$^2$ as in Sample A1. The plated surface of the electrolytic copper foil had an Ra of 44 nm and the copper foil had a 0.2% proof stress of 347 N/mm$^2$ measured in a normal state. Then, the surface of the copper foil was subjected to a CMP process using a polishing machine manufactured by MAT Inc. This CMP treatment was performed for 60 sec with a polishing pad having XY grooves and a colloidal silica polishing solution under the conditions of a pad rotation rate of 80 rpm; a load of 170 gf/cm$^2$, and a liquid supply rate of 30 cc/min. The surface of the copper foil was thereby polished into an ultra-smooth surface. Sample A2 had a Pv/Pp ratio of 1.3 and an Ra of 2.4 nm after CMP process. The 0.2% proof stress of Sample A2, after annealing at 200° C. in a nitrogen atmosphere for 60 min., was measured three times. The results were 301, 289 and 261 N/mm$^2$, respectively. This result demonstrates that Sample A2 has a higher 0.2% proof stress after heat treatment than Sample A1. The electrolytic copper foil, taken out from the CMP processing step in a roll-to-roll process, was observed. Neither undulations nor flares were found as shown in FIG. 8 and FIG. 9.

(Sample A3: High Proof Stress Foil after Heat Treatment)

Sulfuric acid based aqueous copper sulfate solution containing 140 g/L of sulfuric acid and 80 g/L of copper was used to prepare the electrolytic copper foil as in Sample A2 except that the electrolyte solution contained bis(3-sulfopropyl) disulfide (60 ppm), diallyldimethylammmonium chloride (90 ppm), 2-mercapto-5-benzimidazolesulfonic acid (30 ppm), and chlorine (45 ppm). The 0.2% proof stress after annealing at 200° C. in a nitrogen atmosphere for 60 min was 938 N/mm$^2$. The electrolytic copper foil was confirmed to achieve the same effect as Sample A2. The electrolytic copper foil taken out from the CMP processing step in a roll-to-roll process was observed. Neither undulations nor flares were found.

Example B

Examples B1 to B4 described below are reference examples which evaluated electrolytic copper foils after treatment of the front and/or back surfaces. The following examples are referred to as reference examples because no evaluation of 0.2% proof stresses was made.

Example B1: Preparation and Evaluation of Double-Side Treated Copper Foil

A double-side treated copper foil of the present invention was prepared as follows. A commercially available electrolytic copper foil having a thickness of 35 μm (DFF (Dual Flat Foil) manufactured by Mitsui Mining & Smelting Co., Ltd.) was provided. In the following description, the plated surface (Ra: 57 nm) and the drum surface (Ra: 164 nm) of the electrolytic copper foil are referred to as "front surface" and "back surface", respectively. The front surface of the copper foil was subjected to a CMP process using a polishing machine manufactured by MAT Inc. This CMP treatment was performed for 180 sec with a polishing pad having XY grooves and a colloidal silica polishing solution under the conditions of a pad rotation rate of 50 rpm; a load of 170 gf/cm$^2$, and a liquid supply rate of 30 cc/min. The front surface of the copper foil was thereby polished into an ultra-smooth surface.

The back surface of the copper foil was also subjected to a CMP process, which was performed for 180 sec with a polishing pad having XY grooves and a colloidal silica polishing solution under the conditions of a pad rotation rate of 100 rpm; a load of 100 gf/cm$^2$, and a liquid supply rate of 50 cc/min. The copper foil was immersed in 1 mass % hydrogen peroxide solution and then washed with ultrapure water to form a back surface with a concave-dominant surface profile. Evaluations 1 to 3 were performed on the resulting double-side treated copper foil of the present invention.

Evaluation 1: Measurement of Ra and Pv/Pp Ratio

The maximum profile valley depth Pv to the maximum profile peak height Pp was determined on both surfaces of the resulting double-side treated copper foil with a non-contact profilometer (NewView5032, manufactured by Zygo Corp.) in a rectangular area of 181 μm by 136 μm in accordance with JIS B 0601-2001 to calculate a Pv/Pp ratio. At the same time, an arithmetic mean roughness Ra was determined in accordance with JIS B 0601-2001. The specific measurement condition and filtering condition were as follows.

Lens: 50×
ImageZoom: 0.8×
Measured area: 181 μm by 136 μm
Filter High: Automatic
Filter Low: Fixed (150 μm)

Figure 10:
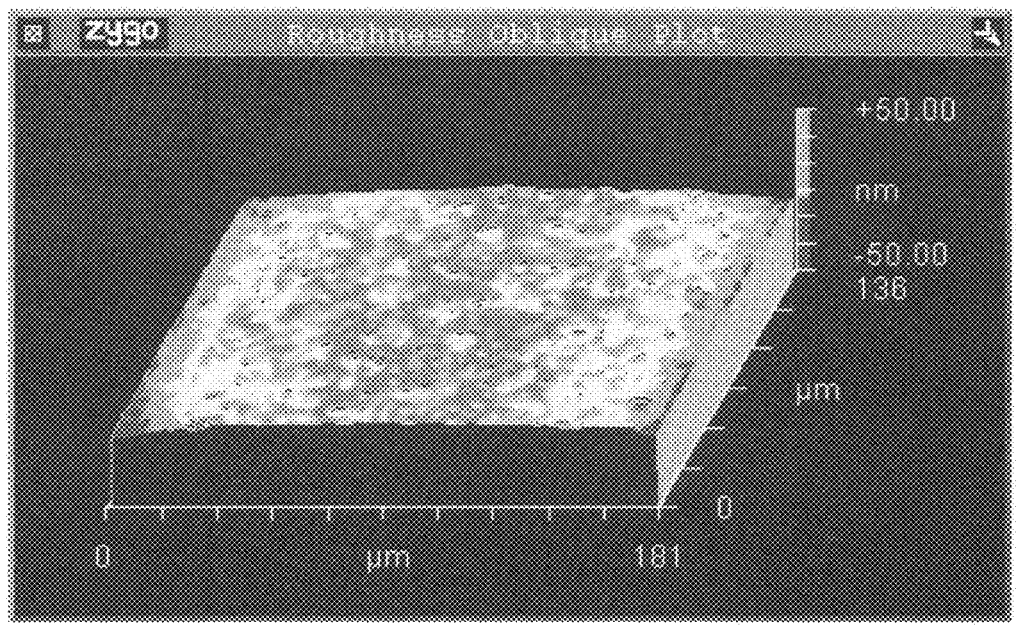
FIG. 10 illustrates a three-dimensional profile of the front surface of the double-side treated copper foil measured in Example B1.
Figure 11:
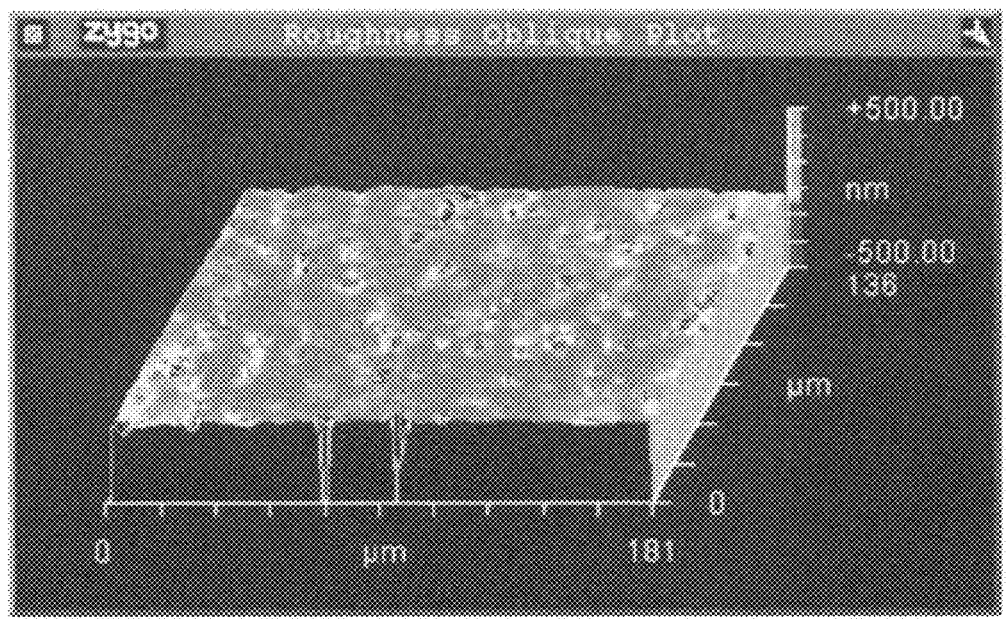
FIG. 11 illustrates a three-dimensional profile of the back surface of the double-side treated copper foil measured in Example B1.

As a result, the Ra and the Pv/Pp ratio of the front surface (ultra-smooth surface) of the double-side treated copper foil were 1.698 nm and 0.7127, respectively, while the Ra and the Pv/Pp ratio of the back surface (concave-dominant surface) of the foil were 11.407 nm and 5.4053, respectively. The three-dimensional profiles of the front surface and the back surface obtained with a non-contact profilometer are shown in FIG. 10 and FIG. 11, respectively.

Evaluation 2: Evaluation of Oxidation Resistance

Figure 12:
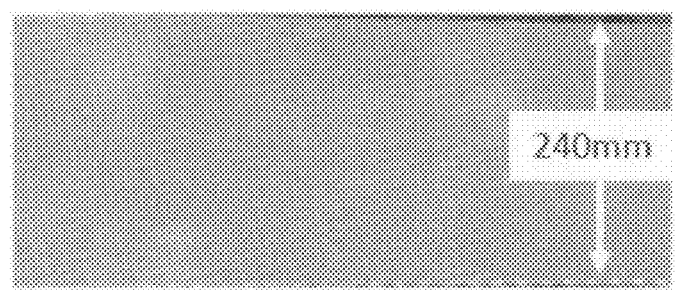
FIG. 12 is a photograph of the front surface of the double-side treated copper foil drawn from the roll that was left in atmosphere for 2 weeks in Example B1.

The double-side treated copper foil was left in a rolled state for 2 weeks in air. The double-side treated copper foil was drawn out from the roll and the surface of the foil was observed to have the appearance with metallic luster, as shown in FIG. 12. The oxidation state of the front surface of the copper foil after being left for 2 weeks was analyzed by a Cu-KLL Auger electron spectrum. This measurement was performed with an X-ray photoelectron spectroscopic (XPS) system (Quantum 2000, ULVAC-PHI Inc.) under the following conditions.

X-Ray source: Al
Output: 40 W
Beam diameter for measurement: 200 μmφ
Measured area: 300 μm by 900 μm (the beam was rastered in this range)
Surveying (for qualitative data): measured range=0 to 1400 eV, path energy=58.7 eV, step=1.0 eV, integrated time=20 min
Narrow measurement (for standing data):
For Cu2p: measured range: 925 to 975 eV, path energy: 23.5 eV, step: 0.1 eV, Number of integrations: 3
For CuKLL: measurement range: 560 to 580 eV, path energy: 23.5 eV, step: 0.1 eV, Number of integrations: 3

Figure 13:
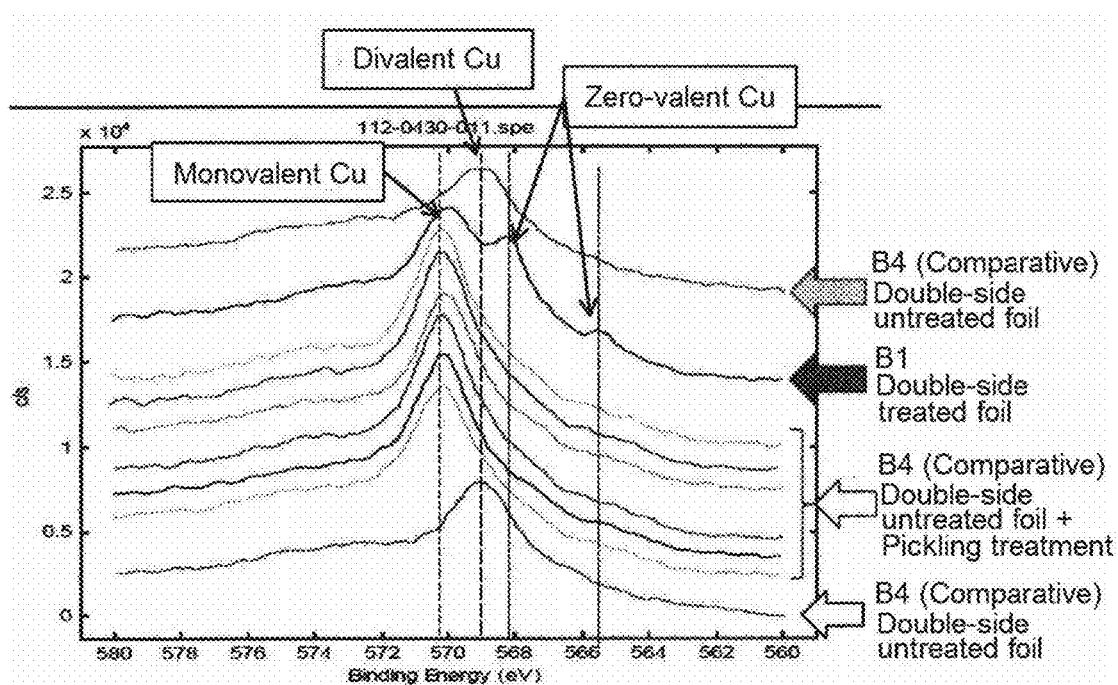
FIG. 13 includes Cu-KLL Auger electron spectra of the copper foil samples in Examples B1 and B4.

The results are shown in FIG. 13, which indicate that peaks attributed to zero-valent Cu (i.e., metal Cu) was observed even after the double-side treated copper foil had been left in a rolled state for 2 weeks in air. Thus, delayed oxidation was confirmed in the double-side treated copper foil.

Figure 14:
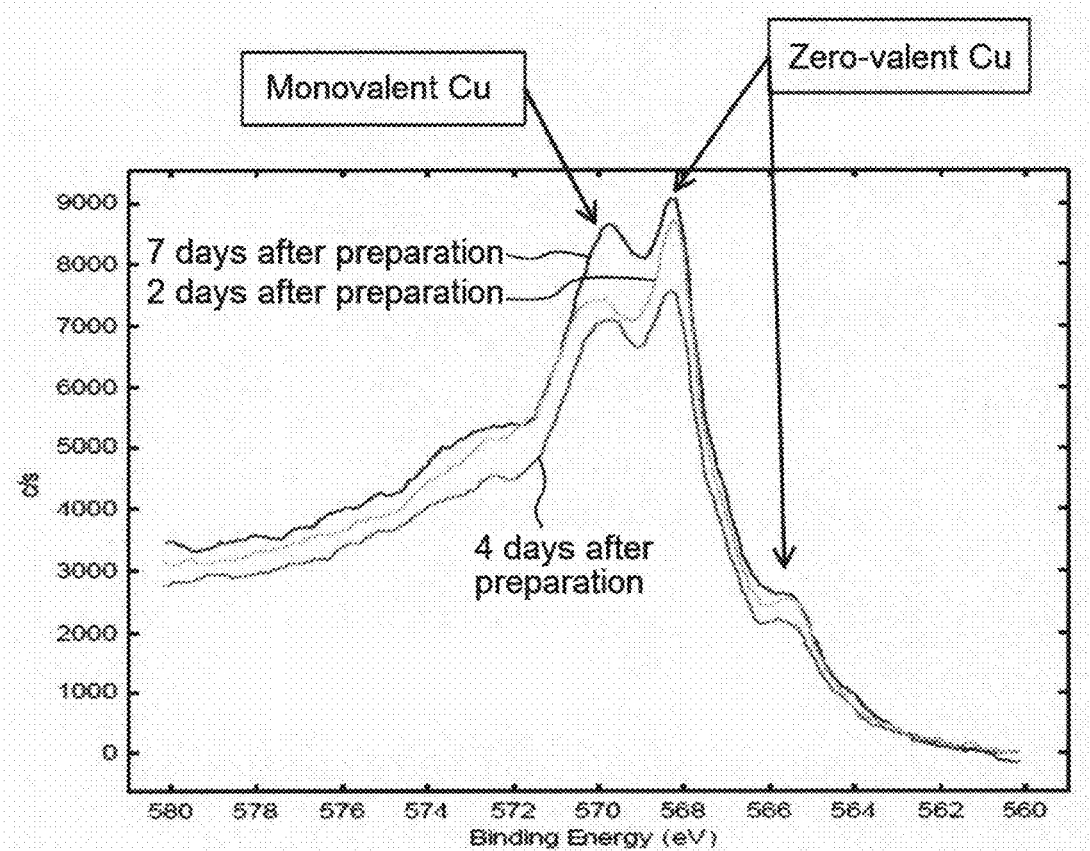
FIG. 14 includes Cu-KLL Auger electron spectra measured at different days after the preparation of the double-side treated copper foil in Example B1.

The Cu-KLL Auger electron spectra of the double-side treated copper foil were measured in the same manner as described above 2, 4, and 7 days after preparation of the foil to give the results in FIG. 14, in which peaks attributed to zero-valent Cu (i.e., metal Cu) were clearly observed in all these days. The ratios of zero-valent Cu to monovalent Cu, calculated on the basis of the peak height in FIG. 14, are shown in Table 1 below, which demonstrates that the content of metal Cu (zero-valent Cu) is the highest in any standing time, and therefore the double-side treated copper foil of the present invention has high oxidation resistance.

TABLE 1

| Standing time after preparation | Zero-valent | Monovalent | Zero-valent/ Monovalent |
| --- | --- | --- | --- |
| 2 days | 8081 | 6267 | 1.29 |
| 4 days | 6962 | 6035 | 1.15 |
| 7 days | 8453 | 7438 | 1.14 |

Evaluation 3: Evaluation of Roll Scratches

Figure 15:
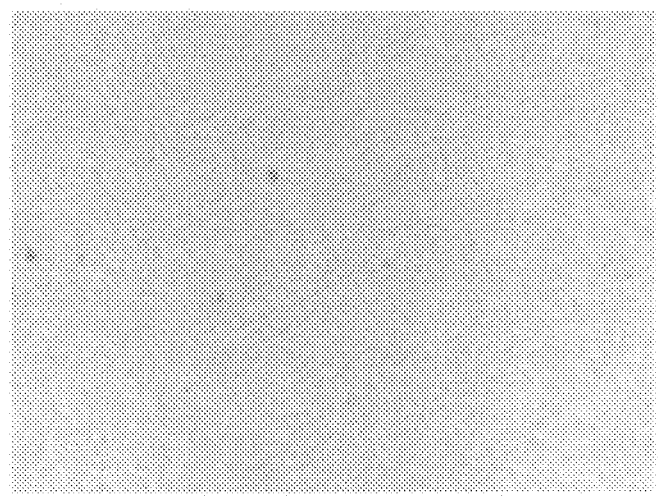
FIG. 15 is a laser microscopic photograph of the front surface of the double-side treated copper foil after being left in a rolled state in Example B1.

The front surface of the double-side treated copper foil drawn out from the roll was observed with a laser microscope (OLS3000, manufactured by Olympus Corporation) to inspect roll scratches on the surface, and the photograph shown in FIG. 15 was obtained. The scale bar indicated in the lower right in the figure is 200 μm. As can be seen from FIG. 15, no significant roll scratch was observed on the front surface of the double-side treated copper foil of the present invention.

Example B2: Preparation and Evaluation of Double-Side Treated Copper Foil

Figure 16:
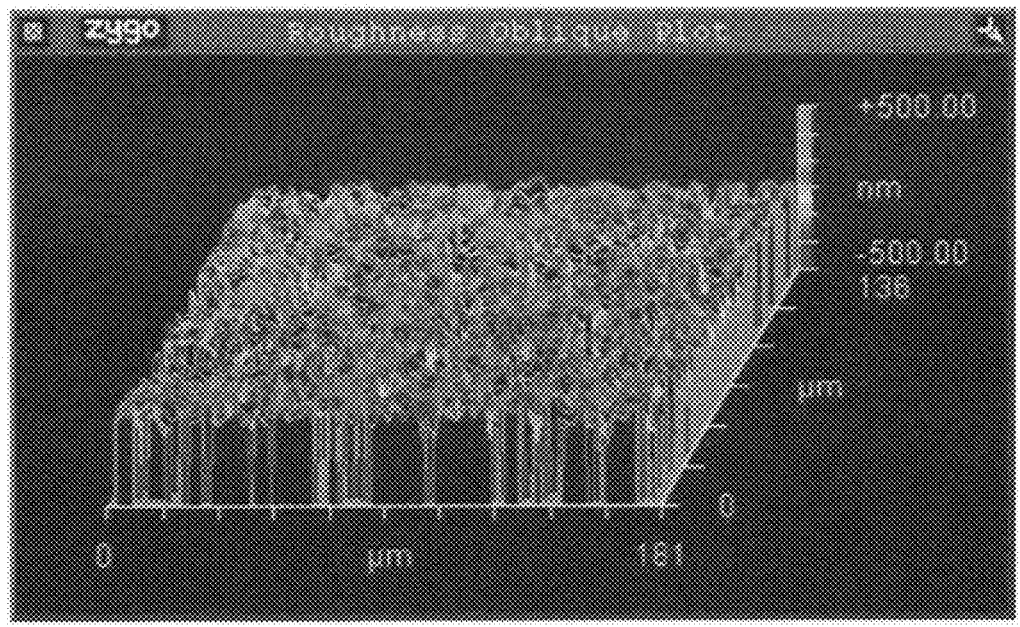
FIG. 16 illustrates a three-dimensional profile of the back surface of the double-side treated copper foil measured in Example B2.

A double-side treated copper foil was prepared and evaluated as in Example B1 except that the time for CMP treatment on the back surface of the copper foil was 60 sec. The resultant Ra and the Pv/Pp ratio of the front surface (ultra-smooth surface) of the double-side treated copper foil were 1.698 nm and 0.7127, respectively, while the Ra and the Pv/Pp ratio of the back surface (concave-dominant surface) of the foil were 56.072 nm and 2.3852, respectively. The three-dimensional profile of the front surface measured with a non-contact profilometer is similar to the profile shown in FIG. 10 and the three-dimensional profile of the back surface was as shown in FIG. 16. The front surface of the double-side treated copper foil, which had been left in a rolled state for 2 weeks in air, was observed to have a similar appearance to that shown in FIG. 12 of Example B1.

Example B3: Preparation and Evaluation of One-Side Treated Copper Foil

Figure 17:
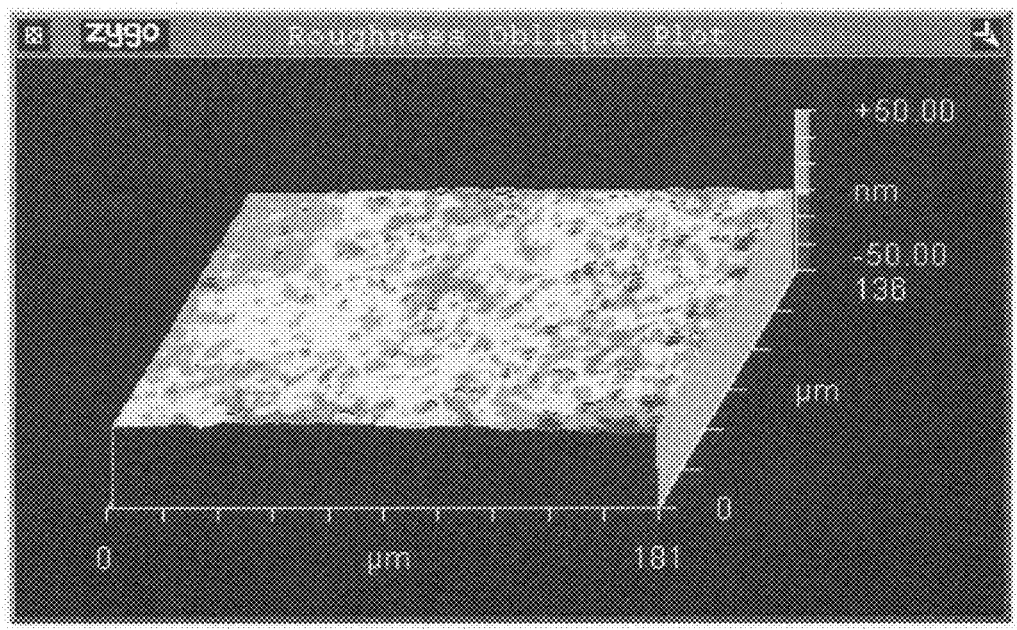
FIG. 17 illustrates a three-dimensional profile of the front surface of the one-side treated copper foil measured in Example B3.
Figure 18:
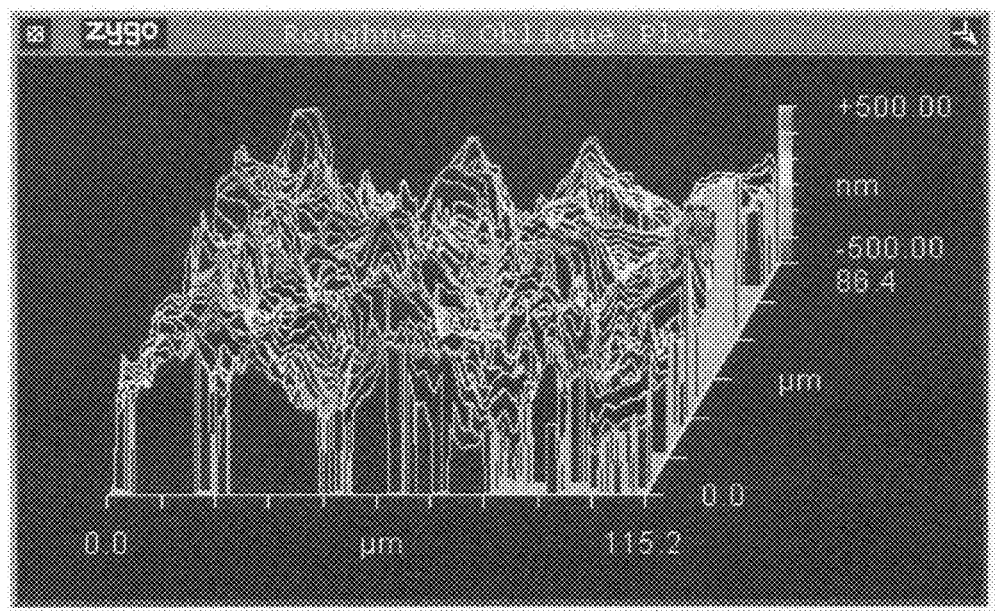
FIG. 18 illustrates a three-dimensional profile of the back surface of the one-side treated copper foil measured in Example B3.
Figure 19:
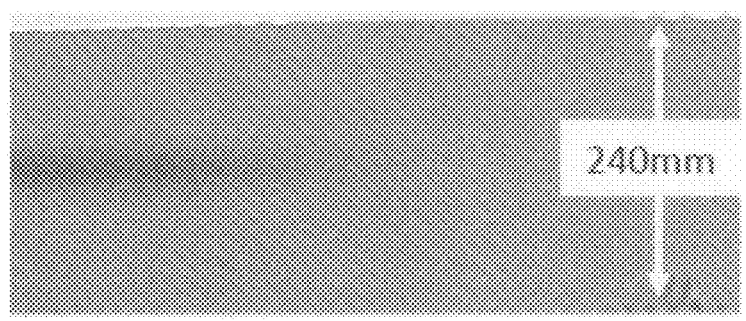
FIG. 19 is a photograph of the front surface of the one-side treated copper foil that was left in a rolled state for 2 weeks in atmosphere in Example B3.
Figure 20:
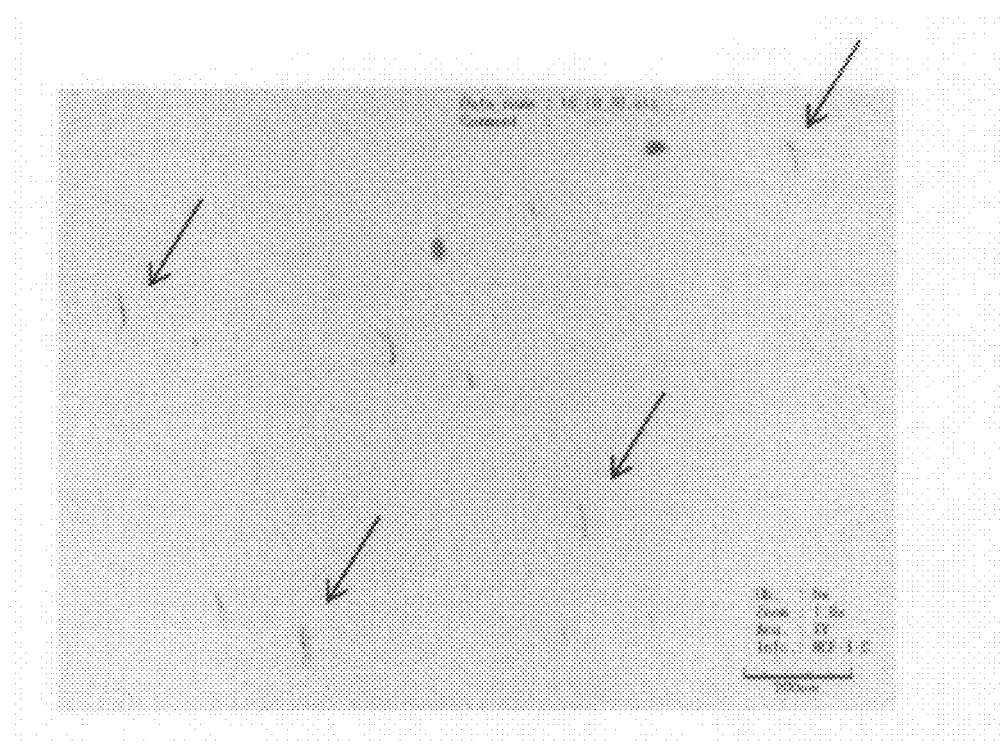
FIG. 20 is a laser microscopic photograph of the front surface of the one-side treated copper foil drawn from the roll that was left in atmosphere for 2 weeks in Example B3. Arrows in the Figure point to roll scratches.

A one-side treated copper foil was prepared and evaluated as in Examples B1 and B2 except that no treatment was given on the back surface of the copper foil. The Ra and the Pv/Pp ratio of the front surface (ultra-smooth surface) of the one-side treated copper foil were 1.313 nm and 1.3069, while the Ra and the Pv/Pp ratio of the back surface of the foil were 164.387 nm and 1.0711. The three-dimensional profiles of the front surface and the back surface measured with a non-contact profilometer are as shown in FIG. 17 and FIG. 18, respectively. The front surface of the one-side treated copper foil that had been left in a rolled state for 2 weeks in air was very thin discolored brownish, exhibiting the resistance to oxidation, as shown in FIG. 19. The front surface of the one-side treated copper foil drawn out from the roll was observed with a laser microscope (OLS3000 manufactured by Olympus Corporation) to inspect roll scratches on the surface, and the photograph is shown in FIG. 20. The scale bar indicated in the lower right in the figure is 200 μm. As is apparent from FIG. 20, several isolated roll scratches were visible on the front surface of the one-side treated copper foil.

Figure 21:
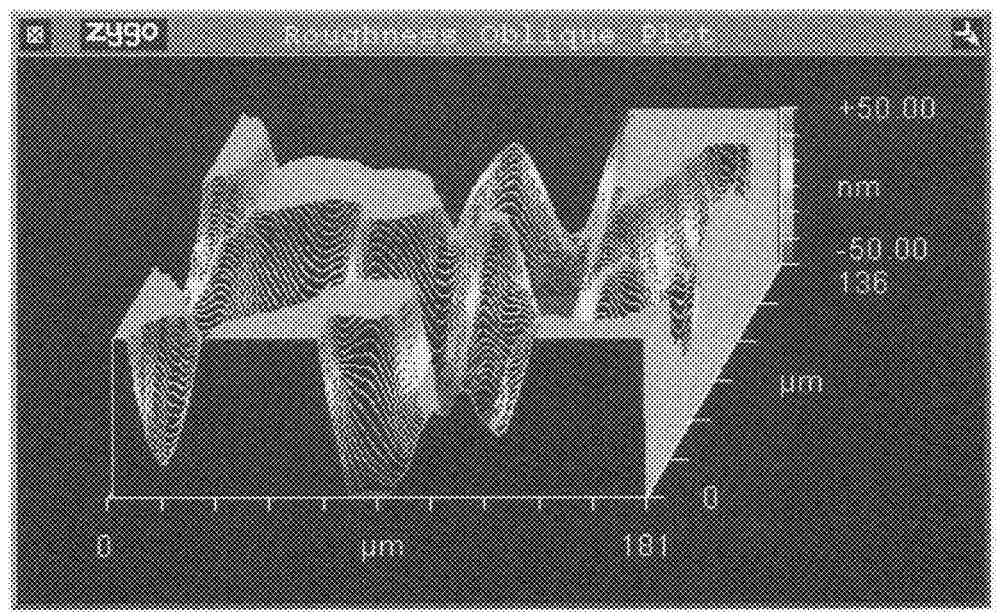
FIG. 21 illustrates a three-dimensional profile of the front surface of the double-side untreated copper foil measured in Example B4.
Figure 22:
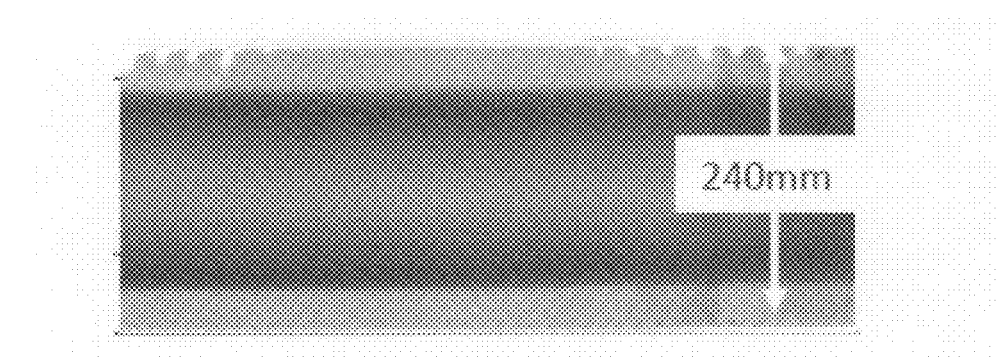
FIG. 22 is a photograph of the front surface of the double-side untreated copper foil drawn from the roll that was left in atmosphere for 2 weeks in Example B4.

Example B4 (Comparative): Preparation and Evaluation of Double-Side Untreated Copper Foil A double-side untreated copper foil was prepared and evaluated in the same manner as in Examples B1 to B3 except that no treatment was carried out on both surfaces of the copper foil. The Ra and the Pv/Pp ratio of the front surface of the double-side untreated copper foil were 57.213 nm and 0.9856, respectively, while the Ra and the Pv/Pp of the back surface of the foil were 164.387 nm and 1.0711, respectively. The three-dimensional profile of the front surface measured with a non-contact profilometer is shown in FIG. 21, while the three-dimensional profile of the back surface is similar to the profile shown in FIG. 18 of Example B3. As shown in FIG. 22, the front surface of the double-side untreated copper foil, which had been left in a rolled state for 2 weeks in air, was discolored much more brownish due to oxidation than the one-side untreated copper foil in Example B3. Accordingly, the double-side untreated copper foil was significantly readily oxidized in a rolled state. The resulting Cu-KLL Auger electron spectrum indicates that the peaks attributed to zero-valent Cu (i.e., metal Cu) was not observed after the double-side untreated copper foil had been left in a rolled state for 2 weeks in air, as shown in FIG. 13. Thus, the double-side untreated copper was confirmed to be easily oxidized.

Furthermore, an attempt was made to remove the oxide layer from the double-side untreated copper foil with dilute sulfuric acid. It was found that the high resistance CuO layer, which corresponds to divalent Cu, was removed, but 2 days after pickling, the surface of the foil was covered with an oxide film of $Cu_2O$, which corresponds to monovalent Cu. The Cu-KLL Auger electron spectrum of the double-side untreated copper foil, which was pickled after being left in a rolled state for 2 weeks in air, is shown in FIG. 13 which clearly indicates that the surface of the foil is covered with the oxide layer of monovalent Cu (i.e., $Cu_2O$) regardless of an attempt to remove the oxide layer. This result demonstrates that such an oxidation resistant surface as achieved by the double-side treated copper foil of the present invention cannot be attained by mere pickling treatment.

Example C

Examples C1 to C4 shown below are reference examples to demonstrate the advantages of a Pv/Pp ratio of 2.0 or more. The following examples are referred to as reference examples because no evaluation of 0.2% proof stresses was made.

Example C1: Measurement of Light Scattering Effect in the Electrode Foils with Various Pv/Pp Ratios (1) Preparation of Samples Samples C1 to C5 of electrode foil with various Pv/Pp ratios were prepared. Then, methods of measuring the surface properties of samples were as follows.
(Arithmetic Mean Roughness Ra)

The arithmetic mean roughness Ra of each sample surface was determined with a scanning probe microscope (Nano Scope V, manufactured by Veeco Instrument Inc.) in accordance with JIS B 0601-2001. This measurement was performed in an area of 10 μm square with a Tapping Mode AFM.
(Pv/Pp Ratio)

The maximum profile valley depth Pv to the maximum profile peak height Pp was determined with a non-contact profilometer (NewView5032, manufactured by Zygo Corp.) in a rectangular area of 181 μm by 136 μm in accordance with JIS B 0601-2001 to calculate a Pv/Pp ratio. The specific measurement condition and filtering condition were as follows.

Lens: 50×
ImageZoom: 0.8×
Measured area: 181 μm by 136 μm
Filter High: Automatic
Filter Low: Fixed (150 μm)

(Sample C1—Comparative)

Sample C1 including a standard reflective film for comparison was prepared as follows. An aluminum film having a thickness of 200 nm was deposited as a reflective layer by sputtering on the surface of a quartz substrate having an arithmetic mean roughness Ra of 0.2 nm. This sputtering was performed under the conditions of an input power (DC) of 1000 W (3.1 $W/cm^2$); an ultimate vacuum of less than $5 \times 10^{-5}$ Pa; a sputtering pressure of 0.5 Pa; an Ar flow rate of 100 sccm; and substrate temperature at room temperature, after mounting an Al target having a purity of 99.99% in a magnetron sputtering apparatus (MSL-464, manufactured by Tokki Corp.) equipped with a cryopump. The surface properties of Sample C1 thus prepared were measured. The arithmetic mean roughness Ra was 0.8 nm and the Pv/Pp ratio was 1.02.

(Sample C2)

Sample C2 having a Pv/Pp ratio of 1.2 or more and less than 2.0 was prepared as follows. As a metal foil, 35 μm thick commercially available electrolytic copper foil (DFF (Dual Flat Foil), manufactured by Mitsui Mining & Smelting Co., Ltd.) was provided. The arithmetic mean roughness Ra of the copper foil surface was 16.5 nm. The surface of the copper foil substrate was chemically polished with a chemical polishing liquid (CPB-10, manufactured by MITSUBISHI GAS CHEMICAL COMPANY, INC). The chemical polishing was performed by immersing the copper foil substrate in a diluted solution of the polishing liquid in water at a (polishing-liquid):(water) weight ratio of 1:2 at room temperature for one minute. The treated copper foil substrate was washed with pure water, cleansed with 0.1 N dilute sulfuric acid, then again washed with pure water and dried. On the polished surface, an aluminum reflective layer was formed as in Sample C1. The surface properties of resulting Sample C2 were measured as in Sample C1. The arithmetic mean roughness Ra was 19.3 nm and a Pv/Pp ratio was 1.86.

(Sample C3)

Sample C3 having a Pv/Pp ratio of 2.0 or more was prepared as follows. As a metal foil, a 35 μm thick commercially available electrolytic copper foil (DFF (Dual Flat Foil), manufactured by Mitsui Mining & Smelting Co., Ltd.) was provided. The surface of copper foil was subjected to CMP treatment with a polishing machine manufactured by MAT Inc. This CMP treatment was performed for 40 sec with a polishing pad having XY grooves and a colloidal silica polishing solution under the conditions of a pad rotation rate of 30 rpm; a load of 200 gf/cm$^2$; and a liquid supply rate of 100 cc/min. The arithmetic mean roughness Ra of the treated copper foil surface was 6.2 nm. The copper foil surface was treated with a running water-type ultrasonic cleaner (manufactured by Honda Electronics Co., Ltd.), at a high frequency output of 60 W for 20 min. On the polished and modified surface, an aluminum reflective layer was formed as in Sample C1. The surface properties of resulting Sample C3 were measured. The arithmetic mean roughness Ra was 16.2 nm and a Pv/Pp ratio was 2.14.

(Sample C4)

Sample C4 having a Pv/Pp ratio of 2.0 or more was prepared as follows. As a metal foil, a 35 μm thick commercially available electrolytic copper foil (DFF (Dual Flat Foil), manufactured by Mitsui Mining & Smelting Co., Ltd.) was provided. The surface of the copper foil was subjected to CMP treatment with a polishing machine manufactured by MAT Inc. This CMP treatment was performed for 60 sec with a polishing pad having XY grooves and a colloidal silica polishing solution under the conditions of a pad rotation rate of 30 rpm; a load of 200 gf/cm$^2$; and a liquid supply rate of 100 cc/min. The arithmetic mean roughness Ra of the CMP treated copper foil surface was 3.1 nm. The copper foil surface was treated with a running water-type ultrasonic cleaner (manufactured by Honda Electronics Co., Ltd.) at a high frequency output of 60 W for 10 min. On the polished and modified surface, an aluminum reflective layer was formed as in Sample C1. The surface properties of resulting Sample C4 were measured. The arithmetic mean roughness Ra was 6.1 nm and a Pv/Pp ratio was 2.54.

(Sample C5)

Sample C5 having a Pv/Pp ratio of 2.0 or more was prepared as follows. As a metal foil, a 35 μm thick commercially available electrolytic copper foil (DFF (Dual Flat Foil), manufactured by Mitsui Mining & Smelting Co., Ltd.) was provided. The surface of copper foil was subjected to CMP treatment with a polishing machine manufactured by MAT Inc. This CMP treatment was performed for 40 sec with a polishing pad having XY grooves and a colloidal silica polishing solution under the conditions of a pad rotation rate of 30 rpm; a load of 200 gf/cm$^2$; and a liquid supply rate of 100 cc/min. The arithmetic mean roughness Ra of the CMP treated copper foil surface was 6.8 nm. The copper foil surface was treated with a running water-type ultrasonic cleaner (manufactured by Honda Electronics Co., Ltd.) at a high frequency output of 60 W for 10 min. On the polished and modified surface, an aluminum reflective layer was formed as in Sample C1. The surface properties of resulting Sample C5 were measured. The arithmetic mean roughness Ra was 13.7 nm and a Pv/Pp ratio was 4.9.

(2) Measurement of Light-Scattering Characteristics

Figure 23:
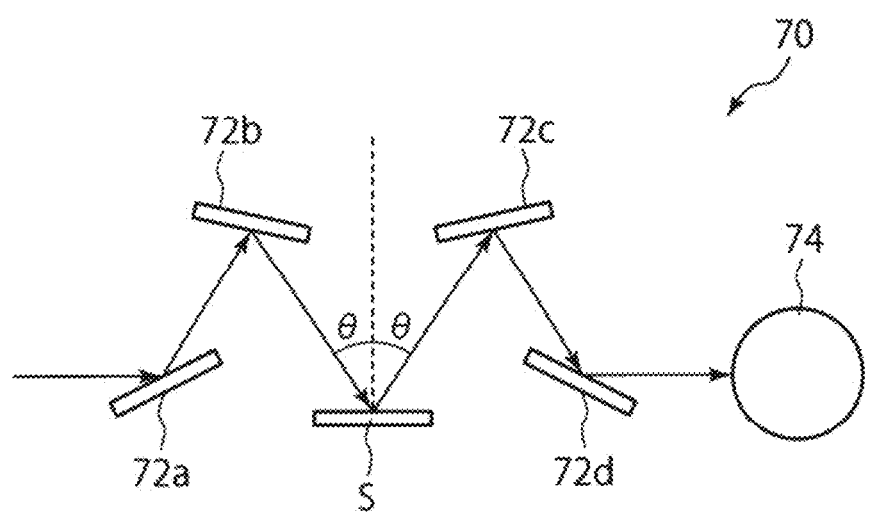
FIG. 23 is a schematic diagram illustrating an optical measuring system used in Example C1.

Light-scattering characteristics of Samples C1 to C5 were measured with a spectrophotometer (U4100, manufactured by Hitachi High-Technologies Corp.). This measurement was performed, as shown in FIG. 23, with the optical measurement system 70 including a plurality of mirrors 72a, 72b, 72c and 72d disposed to guide light to an integrating sphere 74, directing and reflecting light toward or against each sample S at a predetermined angle θ, under the conditions of the measured wavelength region of from 250 nm to 800 nm (entire visible light region) and a scan rate of 300 nm/min. As each sample S scatters more light, the integrating sphere 74 takes less light in the measurement system 70.

The light scattering effect was evaluated such that, the absolute regular reflectances of Samples C2 to C5 were evaluated relative to the absolute regular reflectance (defined as 1) of Sample C1 (the standard reflective film) at reflection angles of 10°, 30° and 60°. In detail, the absolute regular reflectances of Samples C2 to C5 were measured and then divided by the absolute regular reflectance of the standard reflective film (Sample C1). Relative light-scattering values were thereby calculated. The light scattering effect improves with an increase in the relative light-scattering value. As described above, the reflective layer of each sample is composed of the same material (aluminum coat of 99.99% purity) and substantially the same thickness (200 nm (±5%)) such that light absorption conditions or the like due to the material or the thickness of the reflection film were the same. Furthermore, the size of the samples was 80 mm square.

The relative light-scattering values of each sample are shown in Tables 2 to 4 below.

TABLE 2

Relative light-scattering values at reflection angle of 10°

| Sample No. | | Sample C1 (Comparative) | Sample C2 | Sample C3 | Sample C4 | Sample C5 |
|---|---|---|---|---|---|---|
| Pv/Pp ratio | | 1.02 | 1.86 | 2.14 | 2.54 | 4.90 |
| Wavelength | 700 | 1.00 | 1.03 | 1.08 | 1.14 | 1.14 |
| (nm) for | 600 | 1.00 | 0.97 | 1.06 | 1.11 | 1.13 |
| measurement | 500 | 1.00 | 1.03 | 1.10 | 1.15 | 1.17 |
| | 400 | 1.00 | 1.03 | 1.12 | 1.16 | 1.20 |
| | 380 | 1.00 | 1.04 | 1.14 | 1.16 | 1.24 |

TABLE 3

Relative light-scattering values at reflection angle of 30°

| Sample No. | | Sample C1 (Comparative) | Sample C2 | Sample C3 | Sample C4 | Sample C5 |
|---|---|---|---|---|---|---|
| Pv/Pp ratio | | 1.02 | 1.86 | 2.14 | 2.54 | 4.90 |
| Wavelength | 700 | 1.00 | 1.00 | 1.07 | 1.14 | 1.13 |
| (nm) for | 600 | 1.00 | 1.00 | 1.08 | 1.11 | 1.14 |
| measurement | 500 | 1.00 | 1.00 | 1.10 | 1.15 | 1.15 |
| | 400 | 1.00 | 1.00 | 1.10 | 1.16 | 1.20 |
| | 380 | 1.00 | 1.00 | 1.11 | 1.16 | 1.24 |

TABLE 4

Relative light-scattering values at reflection angle of 60°

| Sample No. | | Sample C1 (Comparative) | Sample C2 | Sample C3 | Sample C4 | Sample C5 |
|---|---|---|---|---|---|---|
| Pv/Pp ratio | | 1.02 | 1.86 | 2.14 | 2.54 | 4.90 |
| Wavelength | 700 | 1.00 | 1.00 | 1.02 | 1.09 | 1.11 |
| (nm) for | 600 | 1.00 | 1.00 | 1.02 | 1.07 | 1.12 |
| measurement | 500 | 1.00 | 1.00 | 1.03 | 1.08 | 1.13 |
| | 400 | 1.00 | 1.01 | 1.07 | 1.10 | 1.17 |
| | 380 | 1.00 | 1.01 | 1.08 | 1.10 | 1.18 |

The results show that a Pv/Pp of 2.0 or more yields a scattering effect having a light-scattering value of 0.1 or more, in all reflection angles and wavelength regions.

Example C2: Preparation and Evaluation of Electrode Foils Having Various Surface Properties The conditions shown in Samples C2 to C5 in Example C1 were appropriately modified to prepare various electrode foils each having an arithmetic mean roughness Ra and a Pv/Pp ratio shown in FIG. 24. Light-scattering characteristics of the electrode foils were evaluated as in Example C1. As shown in FIG. 24, samples having Pv/Pp ratios of 2.0 or more exhibited 1.2 times improvement in light-scattering characteristics, while samples having Pv/Pp ratios of less than 2.0 achieved no such high light-scattering. These electrode foils were used to prepare light-emitting elements or power-generating elements. As shown in FIG. 24, the electrode foil having an Ra of 60 nm or less can achieve initial device characteristics without a short circuit with a counter electrode. Accordingly, it is demonstrated that a surface profile having a Pv/Pp ratio of 2.0 or more and an Ra of 60 nm or less is preferable.

Figure 25:
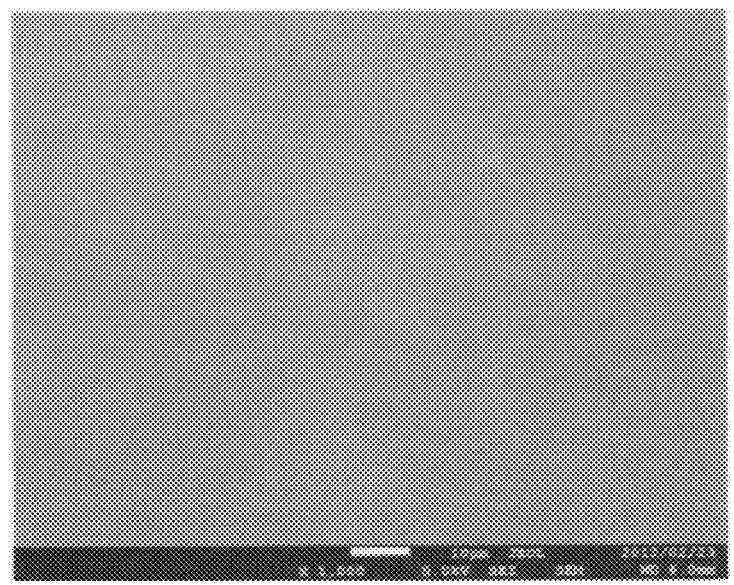
FIG. 25 is an SEM image (1000×) of the surface of Sample C6 shown in FIG. 24.
Figure 26:
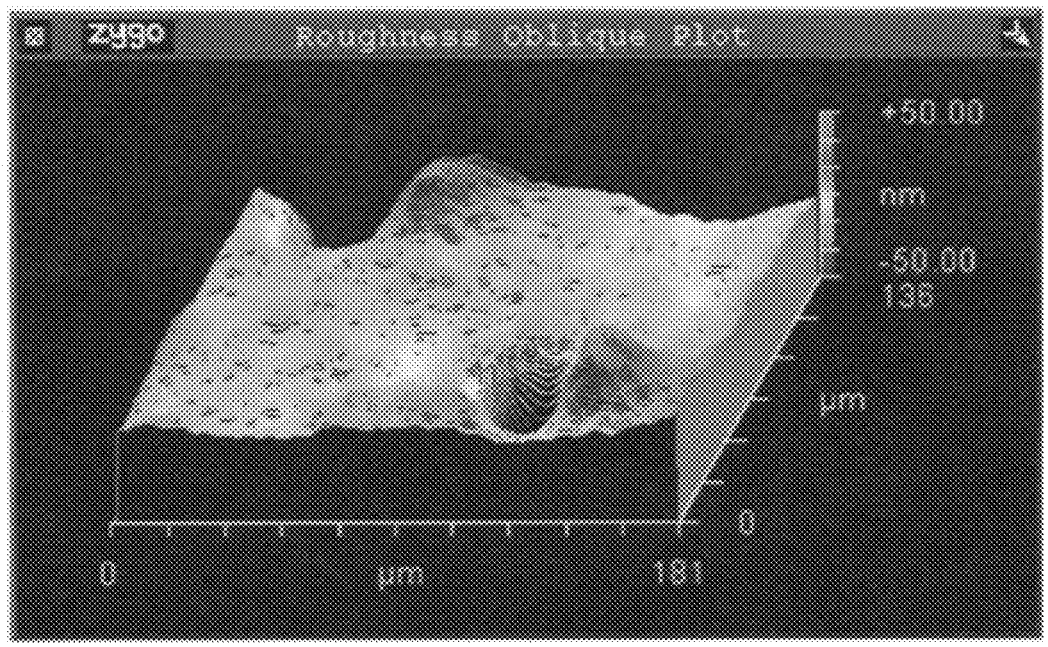
FIG. 26 illustrates a three-dimensional surface profile of Sample C6 shown in FIG. 24, measured with a non-contact profilometer.
Figure 27:
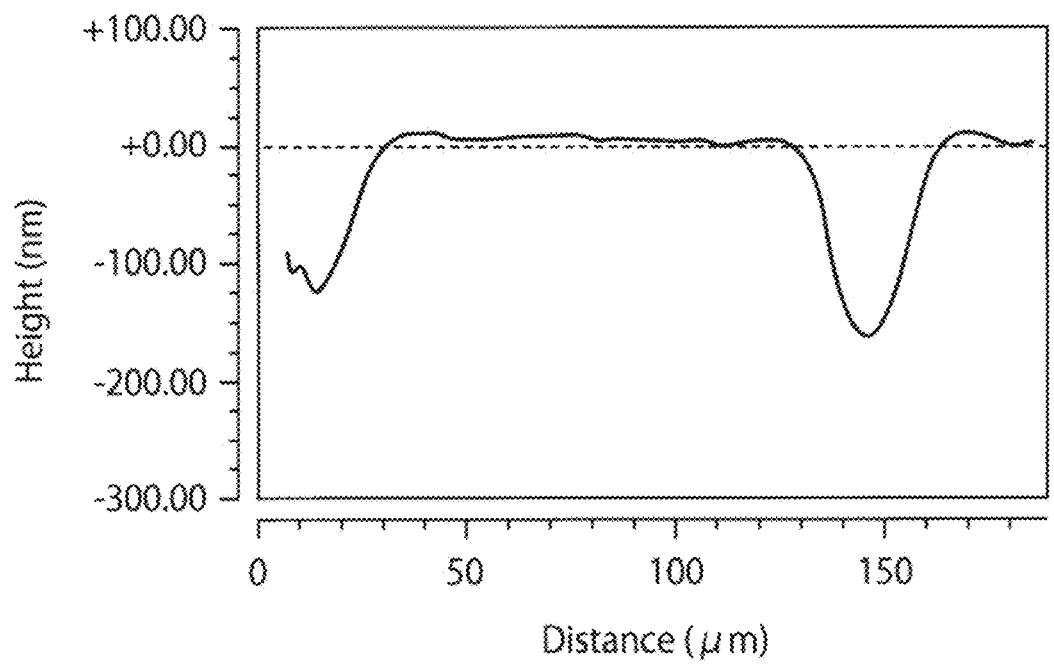
FIG. 27 illustrates a surface profile of Sample C6 shown in FIG. 24, measured with a non-contact profilometer.
Figure 28:
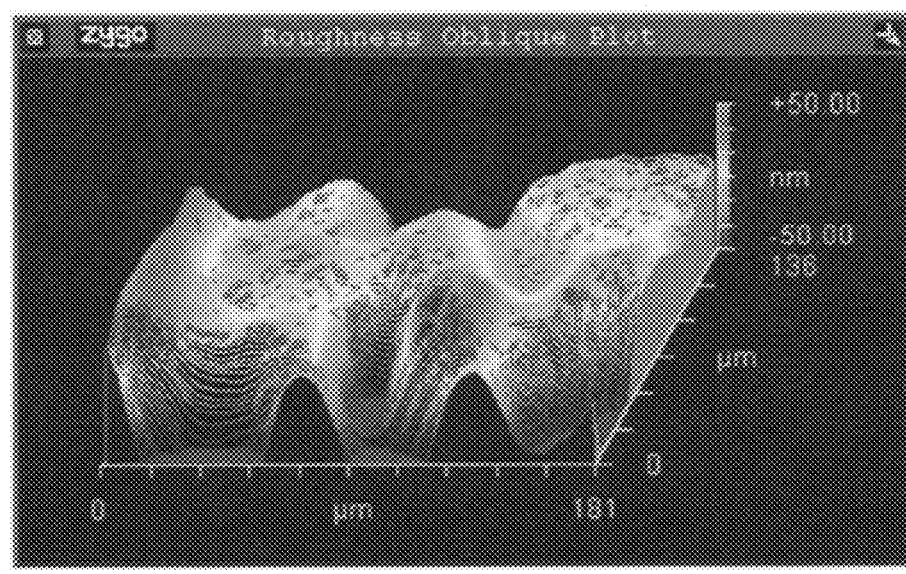
FIG. 28 illustrates a three-dimensional surface profile of Sample C7 shown in FIG. 24, measured with a non-contact profilometer.
Figure 29:
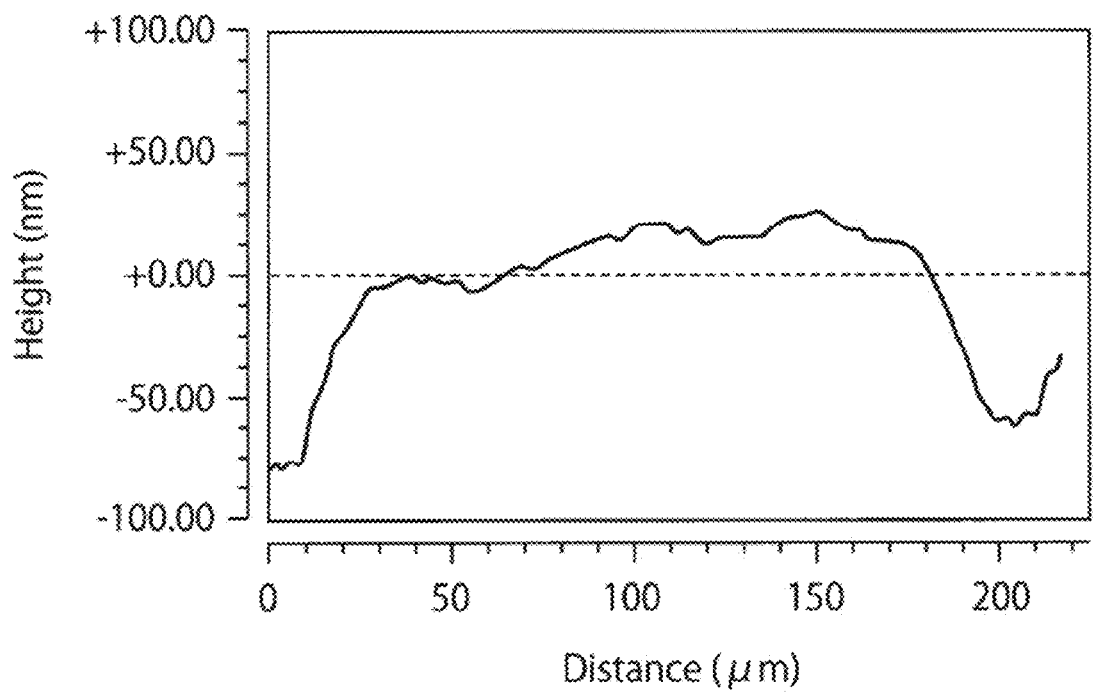
FIG. 29 is a surface profile of Sample C7 shown in FIG. 24, measured with a non-contact profilometer.

The light-scattering surface of Sample C6 indicated by an arrow in FIG. 24 was observed with a SEM (1,000 times). As shown in FIG. 25, a distinct convexo-concave shape was not observed. The surface profiles of Samples C6 and C7 indicated by arrows in FIG. 24 were then measured with a non-contact profilometer (NewView5032, manufactured by Zygo Corp.), resulting in profile images shown in FIGS. 26 to 29. The surface profiles shown in FIGS. 26 and 27 are of Sample C6 with improved light scattering effect according to the present invention, and are desirable surface profiles containing concave portions preferentially formed to convex portions, whereas the surface profiles shown in FIGS. 28 and 29 are of Sample C7 which exhibited poor improvement in the light scattering effect.

Figure 30:
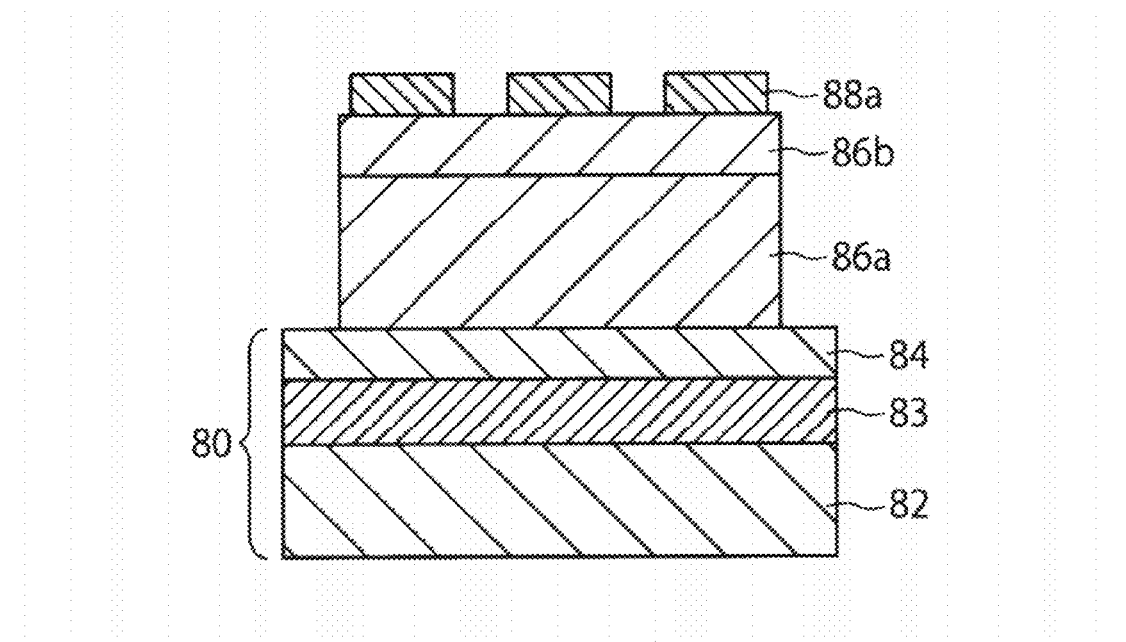
FIG. 30 is a schematic cross-sectional view of a layer structure of a photoelectric element prepared in Example C3.

Example C3: Evaluation of Photoelectric Properties (1) Preparation of Photoelectric Element As shown in FIG. 30, a photoelectric element was prepared with Samples C6 and C7 including the aluminum reflective layer 83 on the copper foil 82, which was prepared as the electrode foil in Example C2. On the aluminum reflective layer 83, an n-type semiconductor buffer layer 84 with a thickness of 20 nm composed of ZnO was formed by sputtering. An interlayer insulating film composed of silicon nitride was formed on the buffer layer 84 in a plasma-enhanced CVD system (PD-2202L, manufactured by SAMCO Inc.). Thin glass sheets having a thickness of 0.1 mm, a width of 2 mm, and a length of 10 mm were then aligned at 2 mm intervals to mask parts to be used for light receiving sections on the electrode foil. After the deposition of silicon nitride, the glass sheets were removed. The electrode foil 80 was then rinsed with 2-propanol warmed to a temperature in the range of 40 to 50° C. and dried with nitrogen gas. Poly-3-hexylthiophene (P3HT) and 6,6-phenyl-C61-butyric acid methyl ester (PCBM) were then added to chrolobenzene into a final concentration of 10 mg/ml for each component, and then kept at about 25° C. for 24 hours to be completely dissolved. The mixed solution of P3HT and PCBM in chlorobenzene was applied onto the electrode foil 80 by spin coating at a rotation rate of 1500 rpm, and a P3HT:PCBM layer 86a with a thickness of 100 nm was prepared. A dispersion of poly(3,4-ethylenedioxythiophene)/poly(4-styrenesulfonic acid) (PEDOT:PSS) (1.3% by weight) was then applied onto the electrode foil by spin coating at a rotation rate of 5000 rpm. The applied electrode was dried on a hot plate at 180° C. for 30 minutes to prepare a PEDOT:PSS layer 86b. Gold was deposited into a thickness of about 100 nm in a vacuum deposition device to prepare a counter electrode 88a. Parts to be used for light receiving sections were masked with a comb-shaped metal mask to avoid blocking light. The sample was then annealed at 150° C. for 30 min in an inert atmosphere (nitrogen). A photoelectric element shown in FIG. 30 was thereby prepared.

(2) Evaluation of Photoelectric Properties

Solar cell power generation efficiency of the prepared photoelectric element was determined with a simulator (XES-4051, manufactured by San-ei electric co., ltd.), an IV monitor (6241A, manufactured by ADCMT Corp.) and software (manufactured by SUNRISE CORP.) under the conditions of an Air Mass (AM) of 1.5 (standard light) or less and an incident light intensity of 100 mW/cm$^2$. The results of measurement are shown in Table 5 and FIG. 31.

TABLE 5

|  | Pv/Pp ratio | Short-circuit Current Jsc(mA/cm$^2$) | Open-circuit Voltage Voc(V) | Fill Factor FF | Conversion Efficiency η(%) |
|---|---|---|---|---|---|
| Sample C6 | 4.9 | 10.0 | 0.5 | 0.6 | 3.0 |
| Sample C7 | 1.9 | 8.5 | 0.6 | 0.5 | 2.5 |

Figure 31:
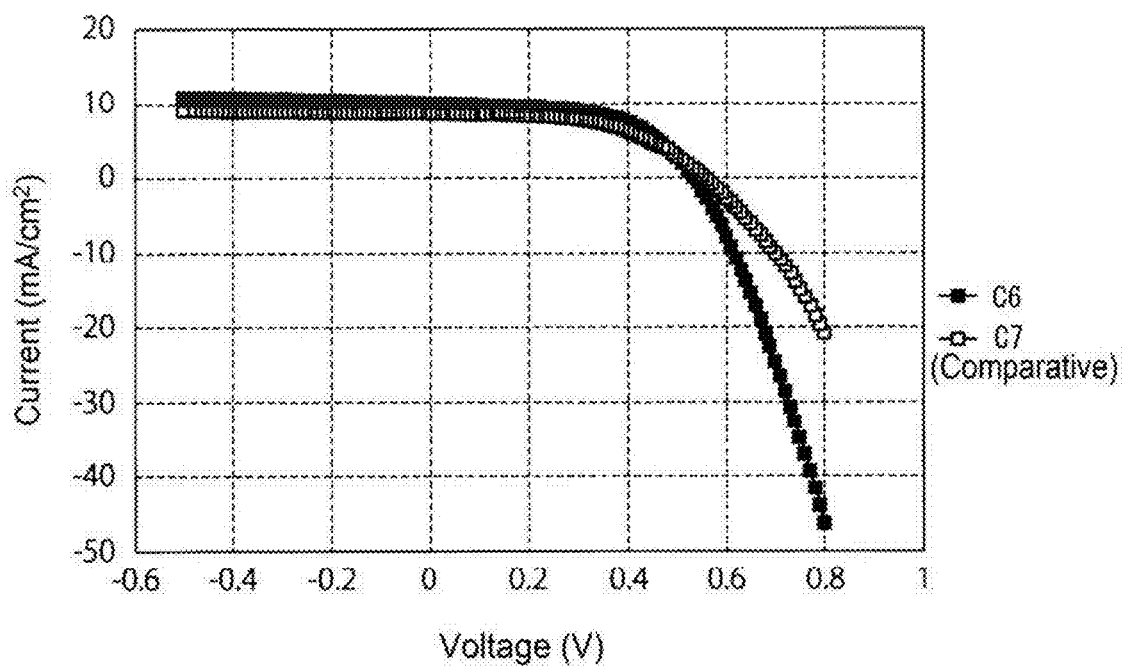
FIG. 31 is a graph illustrating the relationship between voltage and current measured for a photoelectric element in Example C3.

As shown in Table 5 and FIG. 31, Sample C6 having a high Pv/Pp ratio has a fill factor (FF) and a conversion efficiency (η) that are significantly higher than those in Sample C7 having a low Pv/Pp ratio, and thus Sample C6 has a remarkably superior power generation efficiency.

Example C4: Preparation and Evaluation of Concave-Only Electrode Foil

Figure 32:
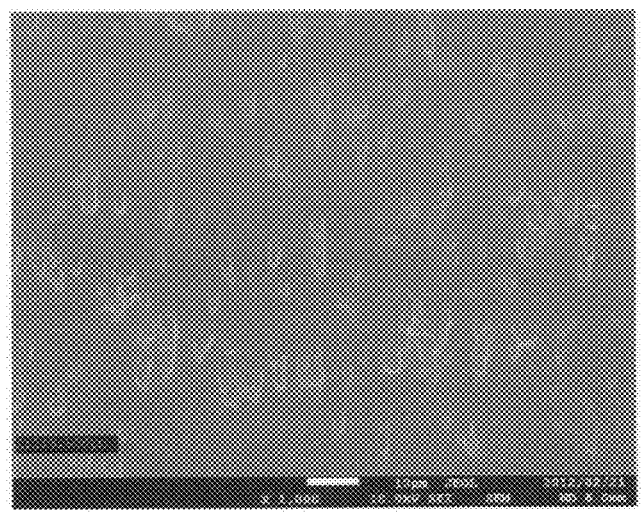
FIG. 32 is an SEM image (1000×) of the surface of Sample C8 prepared in Example C4.
Figure 33:
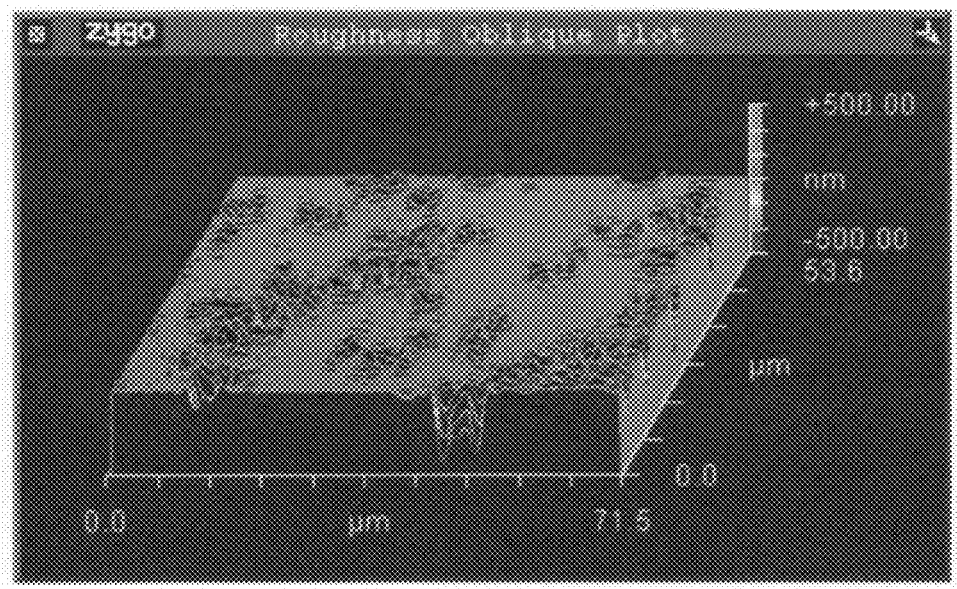
FIG. 33 illustrates a three-dimensional surface profile of Sample C8 shown in FIG. 32, measured with a non-contact profilometer.
Figure 34:
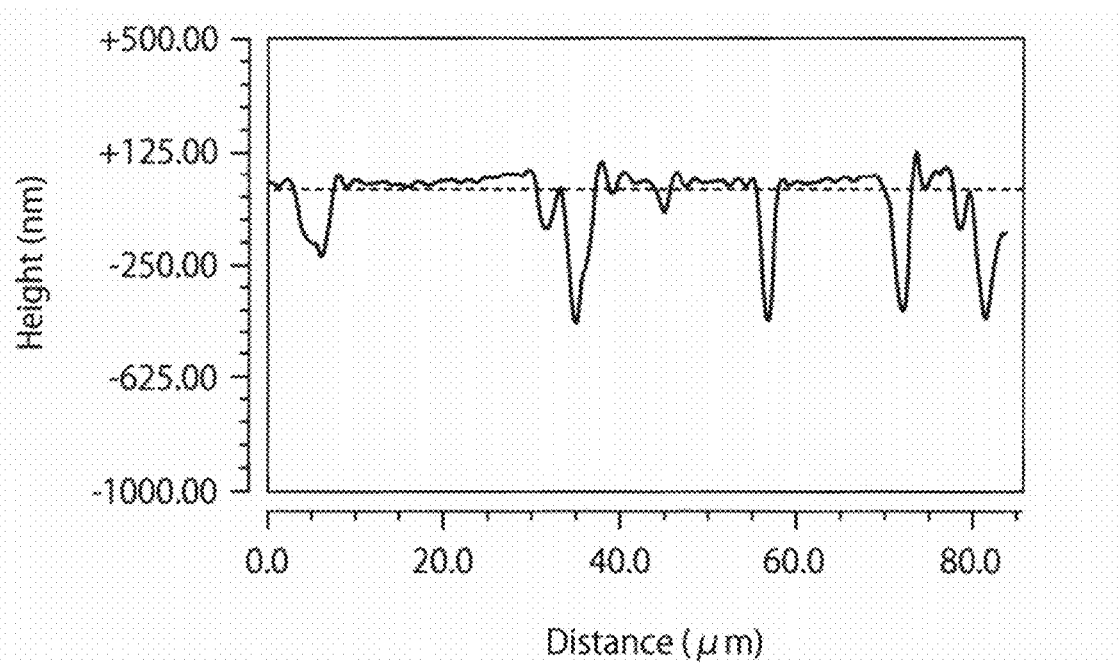
FIG. 34 illustrates a surface profile of Sample C8 shown in FIG. 32, measured with a non-contact profilometer.

An electrode foil as Sample C8 was prepared as in Sample C2, except that a 35 μm thick commercially available electrolytic copper foil (3EC-III, manufactured by Mitsui Mining & Smelting Co., Ltd.) was used as a metal foil and that the CMP treatment was performed for two minutes. The light-scattering surface of Sample C8 was observed with a SEM (1,000 times) to confirm that the surface profile has substantially exclusive concave portions as shown in FIG. 32. Furthermore, the surface profile of Sample C8 was measured with a non-contact profilometer (NewView5032, manufactured by Zygo Corp.), resulting in profile images shown in FIGS. 33 and 34. These results evidentially demonstrate that the light-scattering surface of Sample C8 has an extremely desirable surface profile composed of substantially exclusive concave portions (substantially no convex portions). Most of the observed concave portions had a depth of 1 μm or less and a longitudinal length of 100 μm or less. The number of concave portions counted in a field of view (10,000 μm$^2$) at a magnification of 1,000 of the SEM was about 170. Such an electrode foil having substantially exclusive concave portions can exhibit a superior light scattering, without short circuit between electrodes, and thereby further improve the light-emitting efficiency and power generation efficiency.

Figure 35:
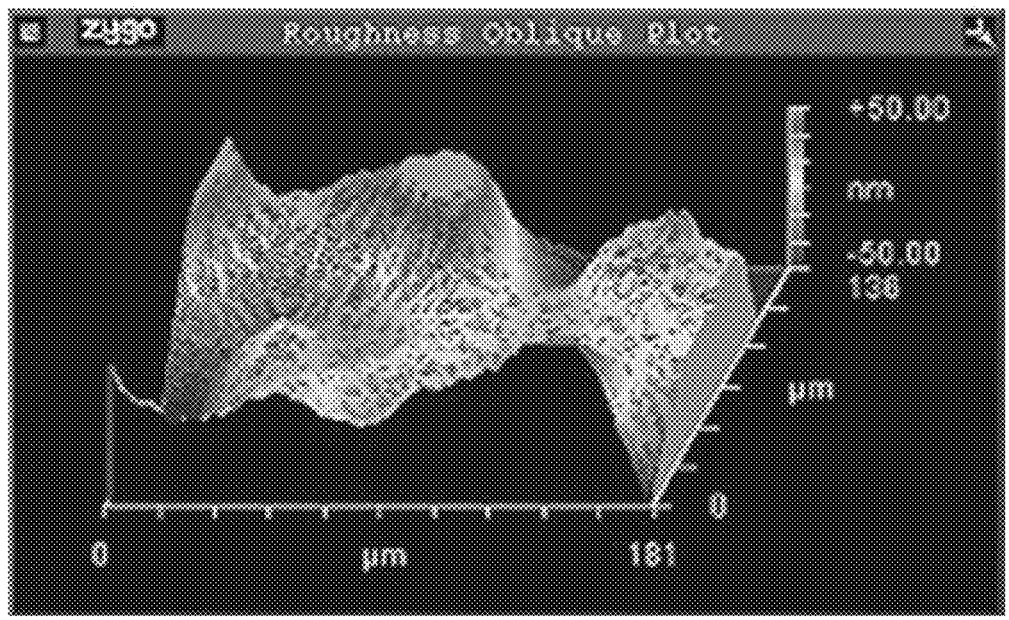
FIG. 35 illustrates a surface profile of Sample D1 in Example D1, measured with a non-contact profilometer.
Figure 36:
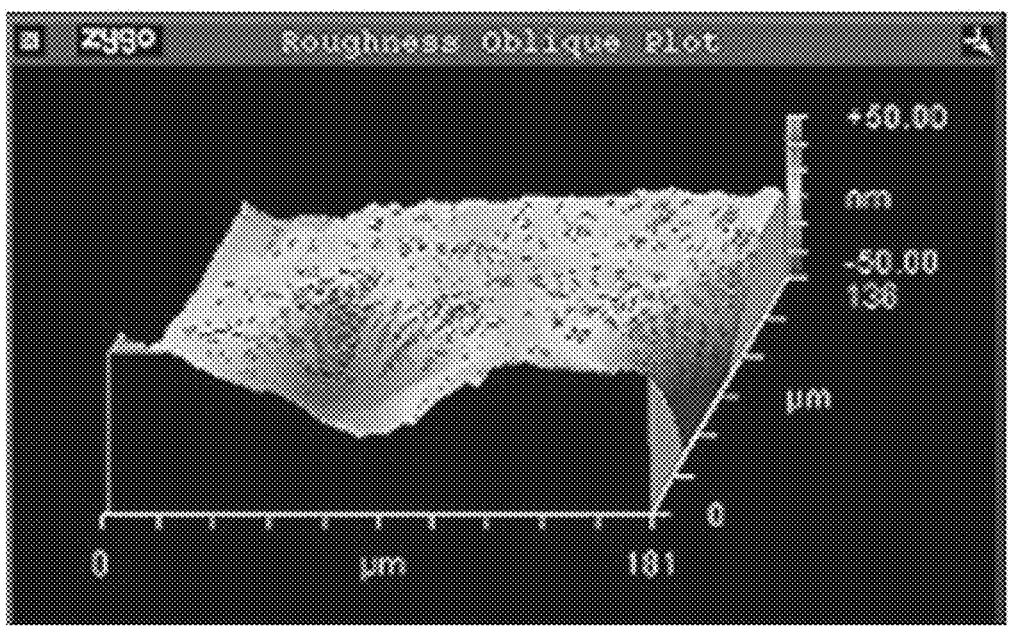
FIG. 36 illustrates a surface profile of Sample D2 in Example D1, measured with a non-contact profilometer.
Figure 37:
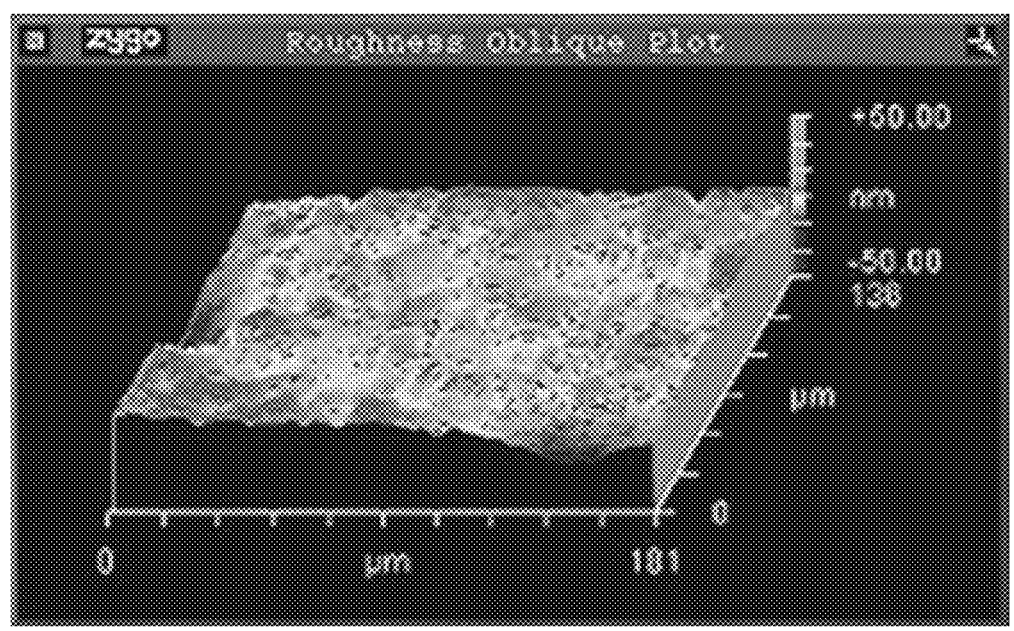
FIG. 37 illustrates a surface profile of Sample D3 in Example D1, measured with a non-contact profilometer.

Example D1: Preparation and Evaluation of Electrode Foils Having Different Arithmetic Mean Roughness Ras and Pv/Pp Ratios The conditions for preparation of Sample A2 in Example A1 were appropriately modified to prepare electrolytic copper foil samples D1 to D3 each having an Ra and a Pv/Pp ratio on the surface shown in Table 6, from which organic EL light-emitting elements were then prepared. The light-emitting elements were evaluated and the results are shown in Table 6. The results in Table 6 can demonstrate that a low Ra and a Pv/Pp of 1.2 or more are preferred to achieve reliable light-emitting elements. Furthermore, the surface profiles of Samples D1, D2, and D3 were measured with a non-contact profilometer (NewView5032, manufactured by Zygo Corp.) to obtain profile images shown in FIGS. 35, 36, and 37.

TABLE 6

| | | | Evaluation in light-emitting element | | |
| --- | --- | --- | --- | --- | --- |
| | Ra | Pv/Pp ratio | Occurrence of light-emitting stripes | Light emission | Overall evaluation |
| Sample D1 (Comparative) | 18.3 | 0.99 | Observed | Inactive due to short circuiting | Low reliability |
| Sample D2 | 9.2 | 1.80 | Not observed | Available | Normal reliability |
| Sample D3 | 2.8 | 1.26 | Not observed | Highly available | High reliability |

The invention claimed is:

1. An electrolytic copper foil for use as an electrode for an electronic device, the electrolytic copper foil comprising copper or copper alloy,
    wherein the electrolytic copper foil has a 0.2% proof stress of 250 N/mm$^2$ or more after heat treatment at 200° C. for 60 min in a nitrogen atmosphere, and
    wherein at least one of the surfaces of the electrolytic copper foil has a concave-dominant surface profile having a Pv/Pp ratio of 2.0 or more, the Pv/Pp ratio being a ratio of a maximum profile valley depth Pv to a maximum profile peak height Pp as determined in a rectangular area of 181 μm by 136 μm in accordance with JIS B 0601-2001.

2. The electrolytic copper foil according to claim 1, wherein the concave-dominant surface profile has a Pv/Pp ratio of 3.0 or more.

3. The electrolytic copper foil according to claim 1, wherein the concave-dominant surface profile has an arithmetic mean roughness Ra of 10 nm or less, determined in accordance with JIS B 0601-2001.

4. The electrolytic copper foil according to claim 1, wherein one surface of the electrolytic copper foil has the concave-dominant surface profile and the other surface has an arithmetic mean roughness Ra of 10 nm or less, determined in accordance with JIS B 0601-2001.

5. The electrolytic copper foil according to claim 1, wherein each surface of the electrolytic copper foil has the concave-dominant surface profile.

6. The electrolytic copper foil according to claim 1, being prepared by a roll-to-roll process.

7. The electrolytic copper foil according to claim 1, wherein the electrolytic copper foil is used as an electrode functioning as a supporting substrate for a flexible electronic device.

8. The electrolytic copper foil according to claim 1, wherein the electrolytic copper foil is used for light-emitting element or a photoelectric element.

9. The electrolytic copper foil according to claim 1, further comprising a reflective layer and/or a buffer layer on the electrolytic copper foil.

10. An electronic device, comprising:
    an electrode foil composed of the electrolytic copper foil according to claim 1; and
    a semiconductor functional layer having semiconductor characteristics provided on an ultra-smooth surface of the electrode foil, wherein the ultra-smooth surface has an arithmetic mean roughness Ra of 10 nm or less, determined in accordance with JIS B 0601-2001.

11. The electronic device according to claim 10, wherein the electronic device further comprises a reflective layer and/or a buffer layer between the electrode foil and the semiconductor functional layer.

12. The electronic device according to claim 10, wherein the semiconductor functional layer has a function of excited luminescence or photoexcited power generation, and thereby the electronic device functions as a light-emitting element or a photoelectric element.

13. The electronic device according to claim 10, wherein the electronic device further comprises a transparent or translucent counter electrode on the semiconductor functional layer.

* * * * *